United States Patent
Hardy

(10) Patent No.: US 9,020,771 B1
(45) Date of Patent: Apr. 28, 2015

(54) DEVICES AND METHODS FOR TESTING THE ENERGY MEASUREMENT ACCURACY, BILLING ACCURACY, FUNCTIONAL PERFORMANCE AND SAFETY OF ELECTRIC VEHICLE CHARGING STATIONS

(71) Applicant: Power Measurements, LLC, Gainesville, VA (US)

(72) Inventor: William H. Hardy, Gainesville, VA (US)

(73) Assignee: Power Measurements, LLC, Gainesville, VA (US)

( * ) Notice: Subject to any disclaimer, the term of this patent is extended or adjusted under 35 U.S.C. 154(b) by 0 days.

(21) Appl. No.: 14/489,724

(22) Filed: Sep. 18, 2014

Related U.S. Application Data

(60) Provisional application No. 62/003,296, filed on May 27, 2014.

(51) Int. Cl.
*G01R 21/00* (2006.01)
*G01R 21/133* (2006.01)
*G06Q 50/06* (2012.01)
*G01R 25/00* (2006.01)

(52) U.S. Cl.
CPC ............. *G01R 21/133* (2013.01); *G06Q 50/06* (2013.01)

(58) Field of Classification Search
CPC ............. G01R 21/133; G01R 31/3624; B60L 11/1824; B60L 11/1816
USPC ..................................................... 702/61–65
See application file for complete search history.

(56) References Cited

U.S. PATENT DOCUMENTS

| | | | |
|---|---|---|---|
| 8,180,584 B2 | 5/2012 | Raichle et al. | |
| 8,198,900 B2 | 6/2012 | Bertness et al. | |
| 8,447,543 B2 * | 5/2013 | Dickinson et al. | ............ 702/60 |
| 2013/0346010 A1 * | 12/2013 | Schulz | ........................ 702/122 |

FOREIGN PATENT DOCUMENTS

EP 2511122 10/2012

OTHER PUBLICATIONS

Electric Vehicle Simulator. Brochure. Jul. 2011. Publication No. PA0040600E. Eaton Corporation, USA.

* cited by examiner

*Primary Examiner* — Phuong Huynh
(74) *Attorney, Agent, or Firm* — Witham Curtis Christofferson & Cook, PC

(57) ABSTRACT

Testing of electric vehicle charging stations (EVCS) is performed using a device operable in either or both an active mode and a passive mode. In an active mode, the device provides or is connected with a programmable load capable of emulating the load of an electrical vehicle (EV). In passive mode, the load is an EV with the device being arranged in series between the EVCS and EV. In either case, energy delivery from the EVCS to the load is monitored by the device to determine energy measurement and billing accuracy of the EVCS. This enables a comparison to be made between a measured value of energy delivered and a metered value of energy delivered as given by the EVCS. Other measurements and safety tests may also be performed by the device.

29 Claims, 11 Drawing Sheets

DEVICES AND METHODS FOR TESTING THE ENERGY MEASUREMENT ACCURACY, BILLING ACCURACY, FUNCTIONAL PERFORMANCE AND SAFETY OF ELECTRIC VEHICLE CHARGING STATIONS

CROSS-REFERENCE TO RELATED APPLICATIONS

This application claims the benefit of U.S. Provisional Patent Application No. 62/003,296, filed May 27, 2014, the complete contents of which are herein incorporated by reference.

FIELD OF THE INVENTION

The invention pertains to testing the energy measurement and billing accuracy, functional performance and safety of electric vehicle charging stations (EVCS).

BACKGROUND

Pluggable electric vehicles (EVs) are rapidly growing in popularity. To support these vehicles, electric vehicle charging stations (EVCS) are being introduced for use in homes, offices, and commercial locations. Initially these charging stations were no more than fancy plugs with a minimum of added functionality to ensure safe operation. The typical envisioned application was a wall mounted device located in the garage of a private home. There was no issue of the charging station needing to measure the energy provided to the vehicle. As pluggable electric vehicles have proliferated, different use scenarios have materialized. In many of these use scenarios, the user must be charged for the energy delivered to the vehicle. When these EVCSs are used in commerce, for example as a paid public refueling station or in a submetering situation where the energy used for vehicle charging receives a different rate from the utility, the EVCS must measure energy accurately so as to provide accurate information for a financial transaction (billing). Just as the gas pumps at filling stations are tested periodically to assure that the customer is being fairly charged, EVCS used in commerce will need to be tested for accurate delivery of electric energy.

Up to this point in time, existing technology developed for testing EVCS operation has been concerned with the communication protocols by which an EVCS exchanges information with an electric vehicle. US Patent Application Publication No. 2013/0346010 A1 by Schulz, for example, discloses a testing system enabled to provide verification signals in compliance with existing charging protocols. Current, voltage, charge sequence, and power levels received from the EVCS may be determined. However, these measures alone as disclosed by Schulz can only serve purposes of ensuring that the charging of the electric vehicle is working within an accepted performance envelope that is required by EV charging standards. For example, Schulz's current measurement devices assist in enabling the testing system to monitor power levels coming from the EV charger and to detect current leakages or other faults in the power provided to the charger testing system. This is important, for example, because determination of power levels ensures that an EVCS will not overwhelm and damage an EV battery with a higher rate of power delivery than it is designed to withstand. A simple analogy is a smartphone battery which, if directly connected to a standard wall outlet without its power adapter, would burn up and be destroyed. In this scenario, Schulz would be concerned with examining the power ratings of the adapter to verify the smartphone battery is not exposed to too strong a current, voltage, or instantaneous power level which would cause damage.

Though systems such as Schulz are relevant to ensuring the safe and protocol-compliant operation of an EVCS with an electric vehicle, they are deficient in addressing energy measurement and billing accuracy. Said differently, there remains a deficiency in the field for a system usable to verify whether EVCSs actually deliver a total amount of energy which they claim to deliver and for which they therefore bill a customer operating the EVCS to charge the battery of his or her EV.

SUMMARY

Some exemplary embodiments of the invention combine into a single tool all of the capabilities needed to verify safety, operation, and importantly energy measurement accuracy.

The number of manufacturers producing electric vehicle charging stations is rapidly growing. Standards on the charging connector and protocol differ from country to country and are evolving rapidly. In the United States all currently manufactured models of major car companies use the SAE J1772-201010 standard. However, a new version of the SAE J1772 standard is currently in development which expands the number of charging methodologies and connectors.

An exemplary embodiment of the invention is a device for testing electric vehicle charging stations (EVCSs) that combines into a single tool all of the capabilities needed to verify safety, operation, and energy measurement accuracy. It differs from prior art in a number of significant ways which may include but are not limited to:

(1) It is capable of being connected in a variety of manners either as a standalone device (e.g., as shown in FIG. 1), or in series with a vehicle being charged (e.g., as shown in FIG. 2);

(2) It is capable of accurately measuring the energy delivered by the EVCS to the electric vehicle (or internal load) or by the electric vehicle to the EVCS;

(3) It is capable of automatically determining the energy which the EVCS has measured as being delivered/received and comparing that to the actual energy delivered/received;

(4) It measures one or more up to all of the following types of energy: active energy (e.g., kWh), reactive energy (e.g., VAR-Hrs), and apparent energy (e.g., VA-Hrs);

An exemplary embodiment of the invention combines the unique features above with functionality found in prior art to form a complete test system for all EVCS systems.

Standards and technologies in the Electric Vehicle Charging space are changing very rapidly. Currently most new US electric vehicles use the SAE J1772-201010 connector and associated protocol. This combination supports AC charging at current levels up to 80 amps. Two levels of charging capacity are defined. AC Level 1 uses 120VAC with current levels up to 16 amps. AC Level 2 uses 208 to 240 VAC with current levels up to 80 amps though levels above 32 amps are not common as of the filing of this application. The Society of Automotive Engineers International (SAE) is about to issue a new version which expands the charging categories to include DC Level 1 (0-80 amps at 50 to 500 VDC) and DC Level 2 (0-200 amps at 50 to 500 VDC). DC Level 1 will use the same connector as AC Levels 1 and 2; however, DC Level 2 will use a new DC Combo connector. Exemplary embodiments of the invention are intended to address all existing, presently under development, and future protocols and connections which transfer power to the vehicle through two power pins at a given time, optionally include a ground pin, and use interlocks and a communication medium to allow the EVCS and vehicle to interact. To meet the needs of a particular future EVCS approach, different embodiments for specific parts of the invention may be required. However, such changes are believed to be within the scope of anyone skilled in the art once the protocols are published and in view of the teachings herein. For example, one embodiment for the present J 1772 standard which uses AC power only may use a current transformer as the current transducer, while a more comprehensive unit addressing AC Level 1 & 2 and DC Level 1 may use a zero flux transformer despite its larger size and greater cost. Alternatively, in this exemplary AC/DC embodiment a current shunt or active closed loop hall effect transformer may be used if lower accuracy is acceptable in a particular application. The application of either is well understood in the field of power measurement.

Some exemplary embodiments of the invention allow testing in an active mode where they provide the load and protocols for testing or in a passive mode where they monitor the interaction between an electric vehicle and an EVCS. In either configuration the system may measure both total energy delivered by the EVCS and metering accuracy.

DETAILED DESCRIPTION

As used herein, "electric vehicle (EV)" may refer to a vehicle which is entirely electric, such as the LEAF (trademark of Nissan) or a Tesla Roadster of Tesla Motors Inc., or a hybrid vehicle which is electrically powered and supplemented by a gas powered engine. The term "electric vehicle charging station (EVCS)" may be used interchangeably with other known industry terms such as "electric vehicle supply equipment (EVSE)". A "test" or "test sequence" in the singular generally refers to a process during which charge, power, or energy is delivered by an EVCS continuously and without interruption. That is to say, once a delivery has been terminated, delivery would not be restarted within the same test or test sequence. Renewed delivery would be identified as part of a subsequent and separate test or test sequence.

Figure 1:
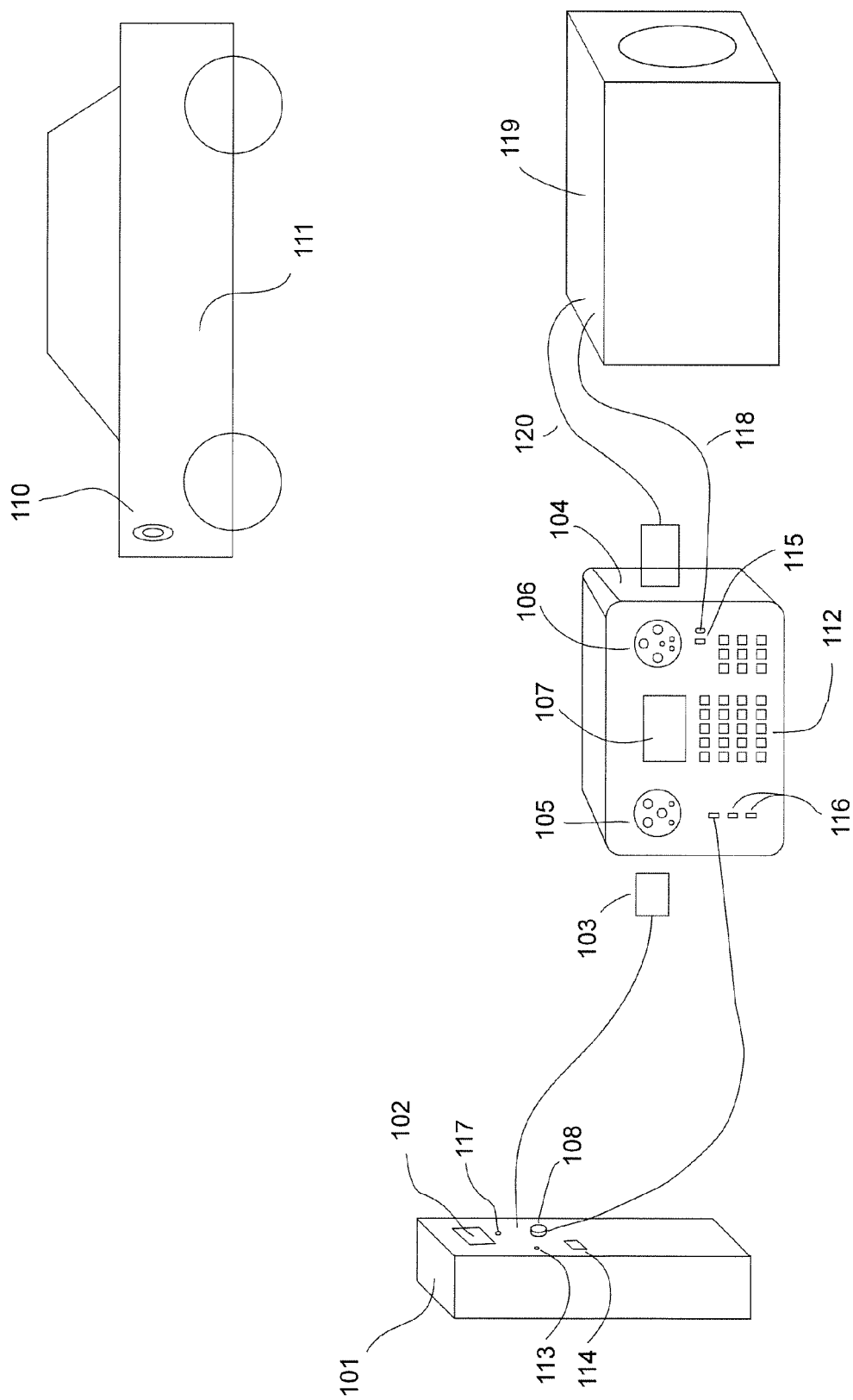
FIG. 1 is a schematic of a testing scenario involving an EVCS and a device according to the invention which may include an internal programmable load or be attachable to a standalone programmable load.

FIG. 1 shows a typical scenario for testing an EVCS. An EVSC 101 is typically an enclosure, which may be free standing or wall mounted. It usually has at a minimum a display 102, a cable with vehicle attachment plug 103, and a start charging button 117. Additional controls and indicators may also be present such as an energy pulse output 113. When designed for the purchase of energy by a customer, a credit card or proprietary card/fob reader 114 may also be present. An exemplary embodiment of the invention is a portable instrument or device 104 which contains all the necessary means for performing its functions. It may use an internal load, separate programmable load, or an electric vehicle (EV) as load for testing. As shown in FIG. 1, the device 104 may include one or more connection means (e.g., primary port 105, secondary port 106, and control port 115) which are discussed in detail below, a display 107 such as a LCD panel for presenting instructions and results to the user, and a user input device such as keypad 112 for communicating with the device. The device 104 may also contain communication ports such as Ethernet and USB 116. More detail of the device's interface to the user is presented below.

According to the exemplary embodiment shown in FIG. 1, the vehicle attachment plug 103 is inserted directly into the primary port 105 of device 104. Some modern EVCSs may have an energy pulse output 113 for testing much like an ANSI C12 compliant revenue meter. In this case an energy pulse pickup 108 of the device 104 may be connected to the energy pulse output 113 of the EVCS 101. When the system is used with a programmable load 119, then no connection is made to the electric vehicle 111 through charging connector/port 110. The most common exemplary embodiments have a separate programmable load 119 to make dissipation of the very large heat generated by the load simpler and make the construction of device 104 more uniform for all embodiments. The programmable load 119 is connected to the main device 104 using a cable 120 which connects to the main device 104 just like an EV and a cable 118 which allows the main device 104 to control the programmable load 119.

Figure 2:
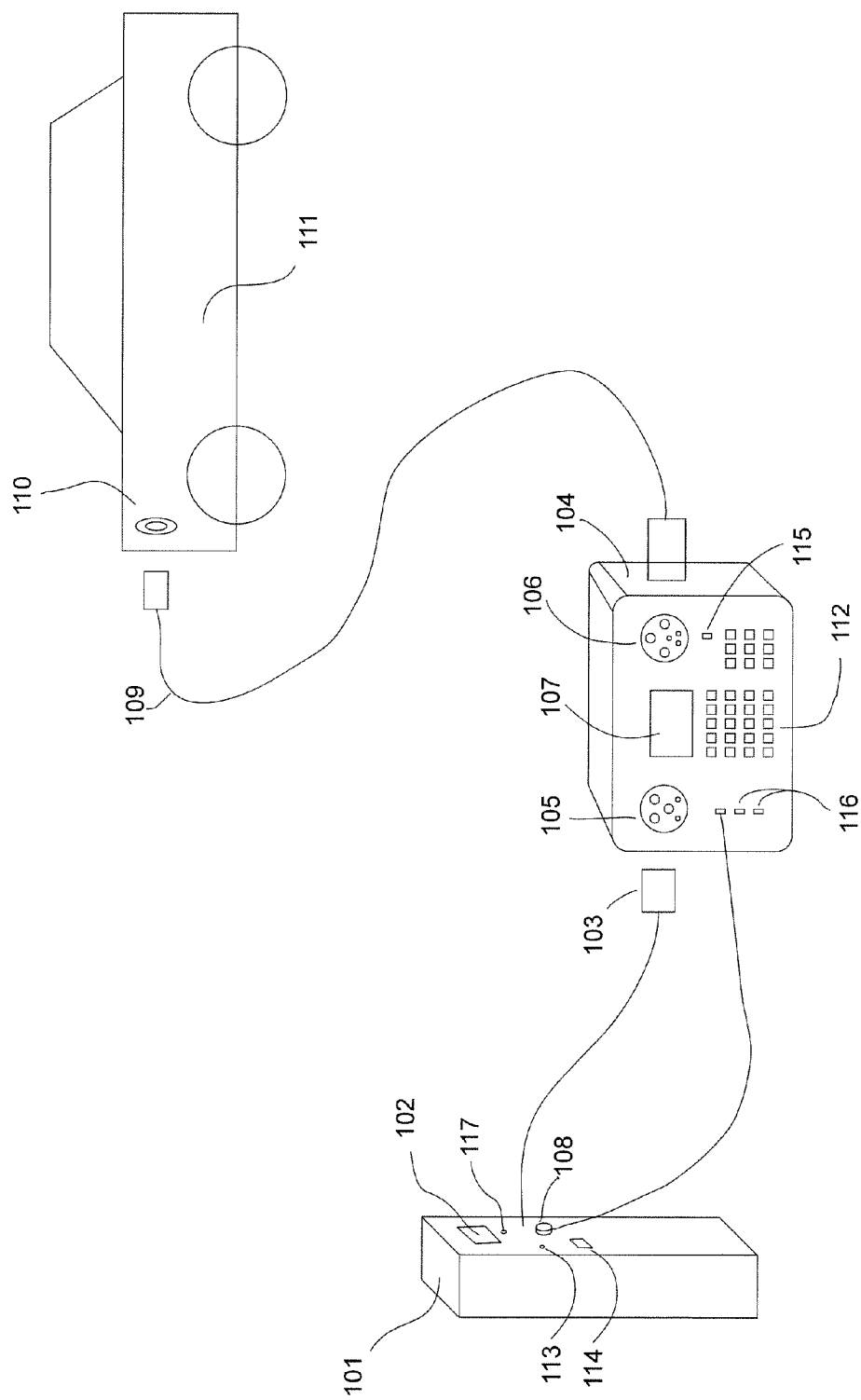
FIG. 2 is a schematic of a testing scenario involving an EVCS, a device according to the invention, and an electric vehicle which may serve as the load.

FIG. 2 shows a different connection scenario for a device 104. In FIG. 2, the EVCS 101 is connected to the device 104 just as in FIG. 1. That is to say, EVCS 101 is connected to device 104 using a cable with a vehicle attachment plug/connector 103 inserted into primary port 105 of device 104. However, instead of the device 104 being connected to a programmable load 119 which emulates an electric vehicle from a communications prospective, an electric vehicle 111 is connected to the secondary port 106 of the device 104 via a cable 109. In this configuration, the device 104 is in series with the EVCS 101 and electric vehicle 111, but the electric vehicle charging proceeds as though the device 104 were not in series. The device 104 may make all of its measurements during the normal charging operation of the vehicle 111. This scenario allows functionality and energy to be measured under real vehicle load which may have significantly different load characteristics than the standard load presented by the load built into the device 104 or the programmable load 119.

Figure 3:
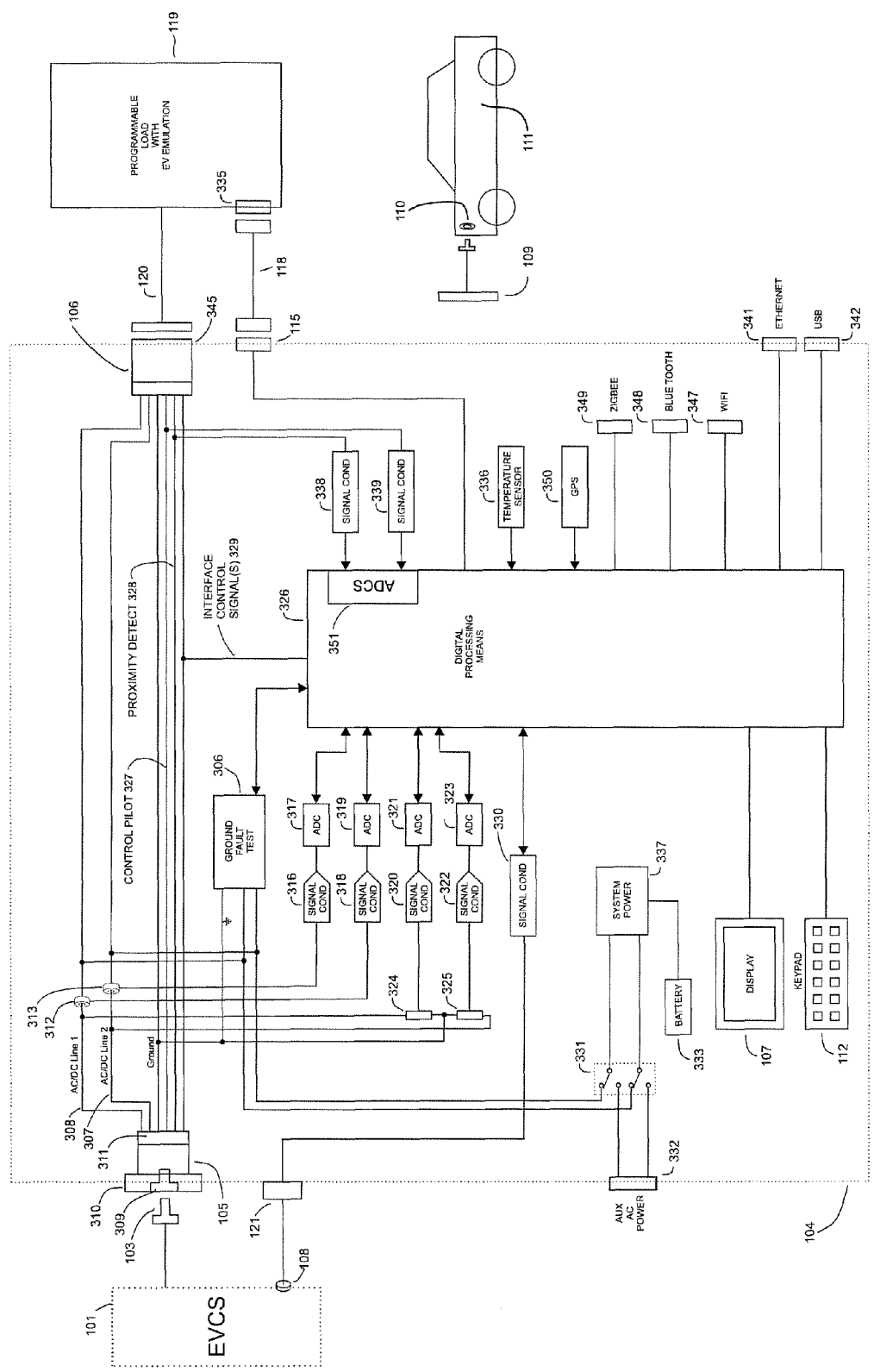
FIG. 3 is a block diagram of an exemplary embodiment of a device according to the invention.

FIG. 3 provides a block diagram of an exemplary embodiment of the invention. The EVCS 101 typically has a captive cable terminated by a connector 103 which plugs into the vehicle 111 through port 110. Most current electric vehicles in the U.S. use the SAE J1772-201010 standard connector. To test an EVCS with a device 104 according to the invention, the plug 103 from the EVCS may be connected to a mating socket 309 of the primary port 105 of the device 104. The mating socket 309 may be a dedicated part of the device 104, or for compatibility with other older or newer evolving standards may include a connector module 310 and interface circuits module 311 which allow the entire primary port 105 to be easily swapped out to accommodate different vehicle connectors and standards.

Independent of the details of the particular connector 103 or primary port 105, at least some exemplary embodiments include some or all of the following components:

(1) Two or more heavy gauge wires carrying the power to the vehicle (in FIG. 3, these are labeled AC/DC Line 1 308 and AC/DC Line 2 307). In the J1772-201010 connector, there are two wires carrying AC power. In the J1772 combo connector under development as of the filing of this application, there are four wires: the original two wires of the J1772-201010 standard capable of supplying AC or DC power, and two additional wires for DC power capable of much higher voltages and current. However, in a specific instance only one pair of wires AC/DC or DC is generally functional at any time;

(2) A ground wire for safety purposes;

(3) A communications channel for proximity detection which is capable of communicating with the vehicle 111 to disable its ability to move while the ECVS 101 is connected. The J1772 protocol uses a single wire with a simple voltage divider to communicate three states: (a) not connected, (b) button pressed, and (c) connected;

(4) A communications channel for transmission of status and required power levels between the EVCS 101 and the vehicle 111. In the present J1772-201010 implementation, a dedicated control pilot line provides communication between the EVCS 101 and the vehicle 111. In future versions of J1772, the control pilot connection may be replaced by an internet protocol communication scheme such as HomePlug Green Phy over the control pilot or power line communication (PLC) or other capable communications technologies.

The inclusion of a connector module 310 and interface circuits module 311 provides one approach to dealing with future standards and protocols. Alternately, specific embodiments with the same functions but different details may be implemented to address as yet unknown connection and protocol details.

The currents flowing in wires 307 and 308 are detected by measuring devices/transducer means 312 and 313, respectively, which in some exemplary embodiments may be any one of the following:

(1) a current transformer (CT). Current transformers are widely used in electricity meters and high accuracy field test sets. They provide the advantage of high accuracy (better than 50 ppm) and full electrical isolation from the power carrying wire. They are also very temperature stable (better than 20 ppm/° C.). Current transformers are not applicable for DC currents.

(2) a Hall effect sensor/transducer. Hall effect transducers are generally less accurate (typically 1.0%) than current transformers and have much worse temperature coefficients (500 ppm/° C.). However, they do provide good electrical isolation and work for either AC or DC currents. Rapid advances in closed loop Hall effect technologies may make this a more viable AC/DC alternative in the near future.

(3) a resistive current shunt. Resistive shunts can provide good accuracy (100 ppm or better) and operate with AC or DC currents. However they do not provide any electrical isolation and have significant temperature coefficients. This means that whatever the charging voltage, it appears at the input of the signal conditioning circuits 316 and 318 which increases the complexity of the system;

(4) a zero flux transformer. A zero flux transformer is a special type of active feedback transformer that works for both AC and DC measurements. It can be accurate (better than 0.03%) and has a very good temperature coefficient (less than 5 ppm/° C.). Its disadvantage is one of physical size and cost. A zero flux transformer may be ten times the size of a similarly rated current transformer and more than ten times the cost.

(5) an AC/DC transducer.

Some embodiments may include only one of the two transducers 312 and 313 since that is all that is required by Blondel's Theorem to accomplish the power measurement task. The two signal conditioning circuits 316 and 318 transform the signals from the transducer means 312 and 313 to the appropriate levels needed by each analog to digital converter (ADC) 317 and 319 for optimal performance. The signal conditioning circuits may include programmable gain amplifiers controlled by the digital processing means 326. The analog to digital converters 317 and 319 convert the analog signals from the signal conditioning circuits 316 and 318 to digital form and transmit the information to the digital processing means 326.

Figure 4A:
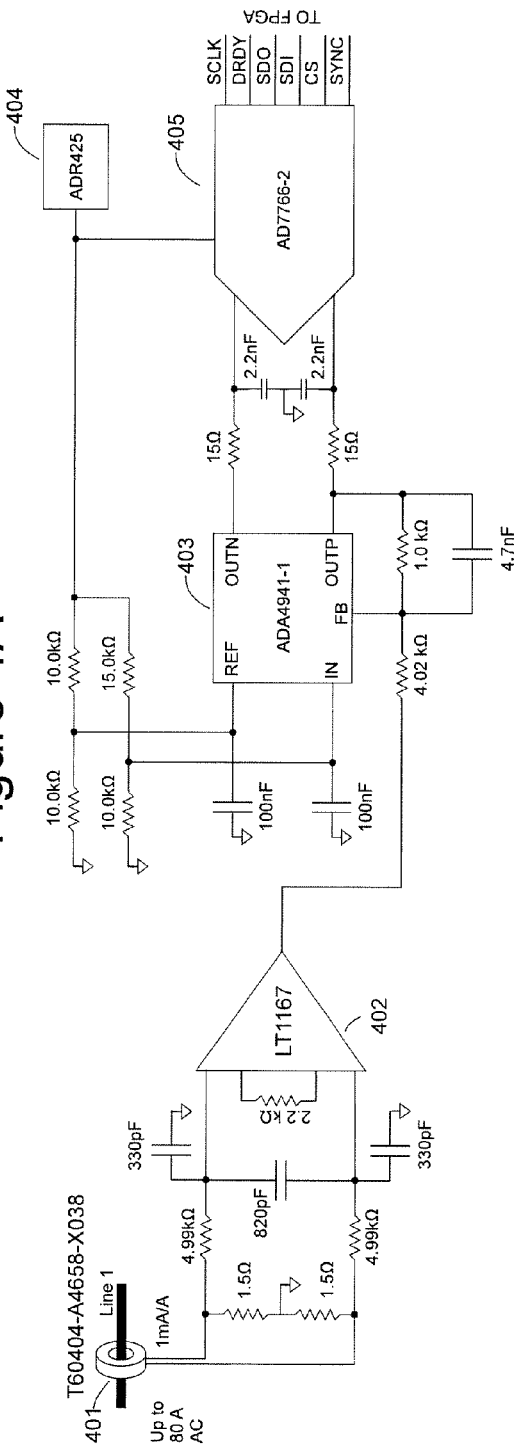
FIG. 4A is a sample embodiment using a current transformer, signal conditioning, and analog-to-digital converter (ADC)

One embodiment of the signal processing chain for current measurement is shown in FIG. 4A. Here the transducer is a current transformer 401. The output of the current transformer 401 is significantly less than the current flowing in wire 308 (i.e., Line 1), e.g., a current $1/1000^{th}$ of the current flowing in Line 1. This current is converted into a voltage signal. This may be accomplished by, for example, passing the current through the two 1.5 ohm resistors. As an example, an 80 amp rms current in Line 1 is reduced by the example circuit shown in FIG. 4A to a 0.240 volt rms signal. The signal processing means may include or consist of a differential input amplifier 402 and a level shifting differential output amplifier 403. According to the present example, amplifier 402 may change the signal level from 0.240 volts rms to approximately 10 volts peak-to-peak. Amplifier 403 may then convert this 10V signal to a 5 volt peak-to-peak signal with an offset appropriate for the ADC 405. A voltage reference 404 provides a precise stable voltage as reference to the ADC 405 and amplifier network. Power supplies and filter capacitors are not shown for simplicity but would generally be included. A preferred ADC for all four instances in this system (that is, ADCs 317, 319, 321, and 323 shown in FIG. 3) is a high resolution (e.g., 24 bit), over-sampled SAR converter similar to an Analog Devices AD7766-2. Important parameters are gain and offset accuracy and stability, an internal digital filter that provides a sharp frequency cutoff, a very large dynamic range, and a very high signal to noise ratio.

To measure the energy delivered both the current and the voltage must be measured simultaneously. One or more transducers such as resistive voltage dividers may be provided to measure voltage on the supply lines. The measuring devices/transducers 324 and 325 which measure voltage from lines 308 and 307, respectively, are generally resistive voltage dividers. FIG. 3 shows a configuration with two voltage dividers (namely transducers 324 and 325) although other equivalent configurations may also be used in alternative embodiments. The voltage dividers precisely reduce the voltages of the supply lines from a high level (typically 120 to 500 V) to a low level (typically 1 to 10 V) that can be processed by the signal conditioning circuits 320 and 322. The signal conditioning circuits may include programmable gain amplifiers controlled by the digital processing means 326. The analog to digital converters 321 and 323 convert the analog signals from the signal conditioning circuits 320 and 322, respectively, to digital form and transmit the information to the digital processing means 326.

Measurement of the current flowing in conductors 307 and 308 always requires isolation from the voltages on the same lines. This may be accomplished through the use of an inherently isolated sensor like a CT, hall device, or zero flux transformer, or through special isolated front end circuitry.

Figure 4B:
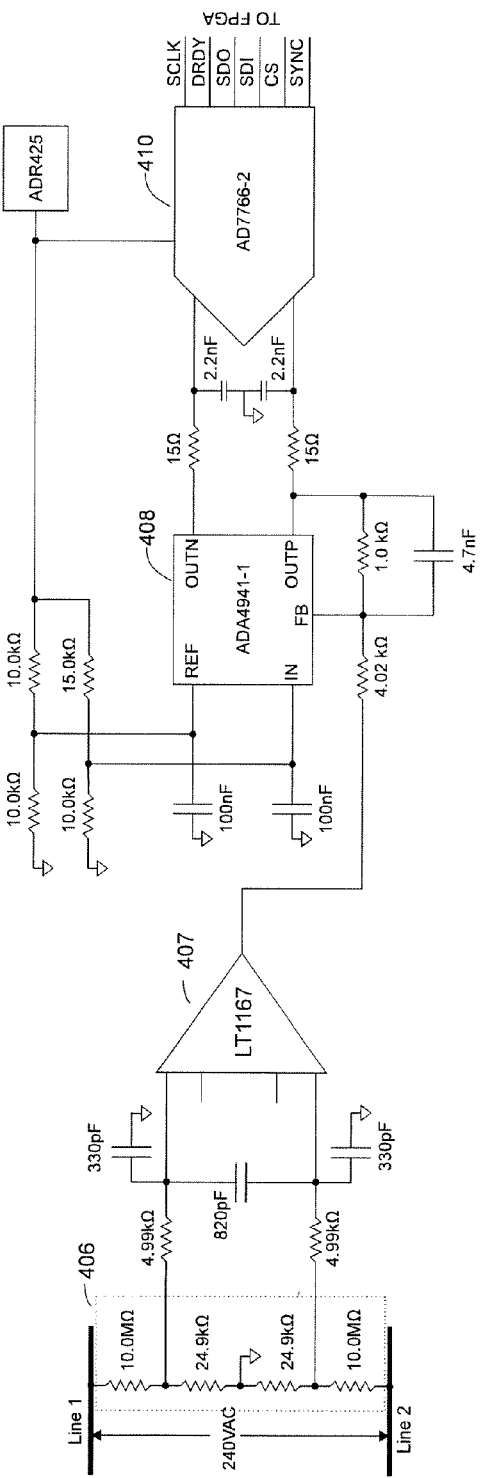
FIG. 4B is sample embodiment of a voltage transformer, signal conditioning, and analog-to-digital converter (ADC)

One alternative embodiment of the signal processing chain for voltage measurements is shown in FIG. 4B. Here the transducer is a resistive voltage divider 406 which reduces the signal voltage from the supply lines 308 and 307 by several orders of magnitude. In the illustrative example shown, the output of the voltage divider is a voltage 24.9/1024.90=0.0242950 times the input voltage difference of Line 1 and Line 2. For a 240 volt rms difference the output voltage is 5.8308 volts rms. The signal processing means may include or consist of a unity gain differential input amplifier 407 and a level shifting differential output amplifier 408. Amplifier 407 acts as a very high impedance buffer. A gain of other than unity may be required to match the input requirements of the ADC. Amplifier 408 converts this signal to a 5 volt peak-to-peak signal with an offset appropriate for the ADC 410. The voltage reference 409 may be included to provide a precise stable voltage as reference to the ADC 410 and amplifier network. Power supplies and filter capacitors are not shown for simplicity but would generally be included.

The digital processing means (DPM) 326 generally contains at least programmable logic, a microprocessor core, flash memory, and RAM memory. In this particular embodiment it also contains several low resolution ADCs 351. Depending on the specific chip chosen for any given embodiment, more of the operations may be executed in firmware as opposed to programmable logic. It will be apparent to those of skill in the art in view of the teachings herein whether to embody particular operations discussed herein in programmable logic versus firmware. The DPM 326 provides control information to many of the interfaces in the device 104. It may also provide timing and collect multiple streams of data. If the EVCS 101 is equipped with an energy pulse output 113 then the energy pulse pickup 108 may be connected to the EVCS 101 so the device 104 can automatically track how much energy has been delivered according to the EVCS 101.

Figure 5:
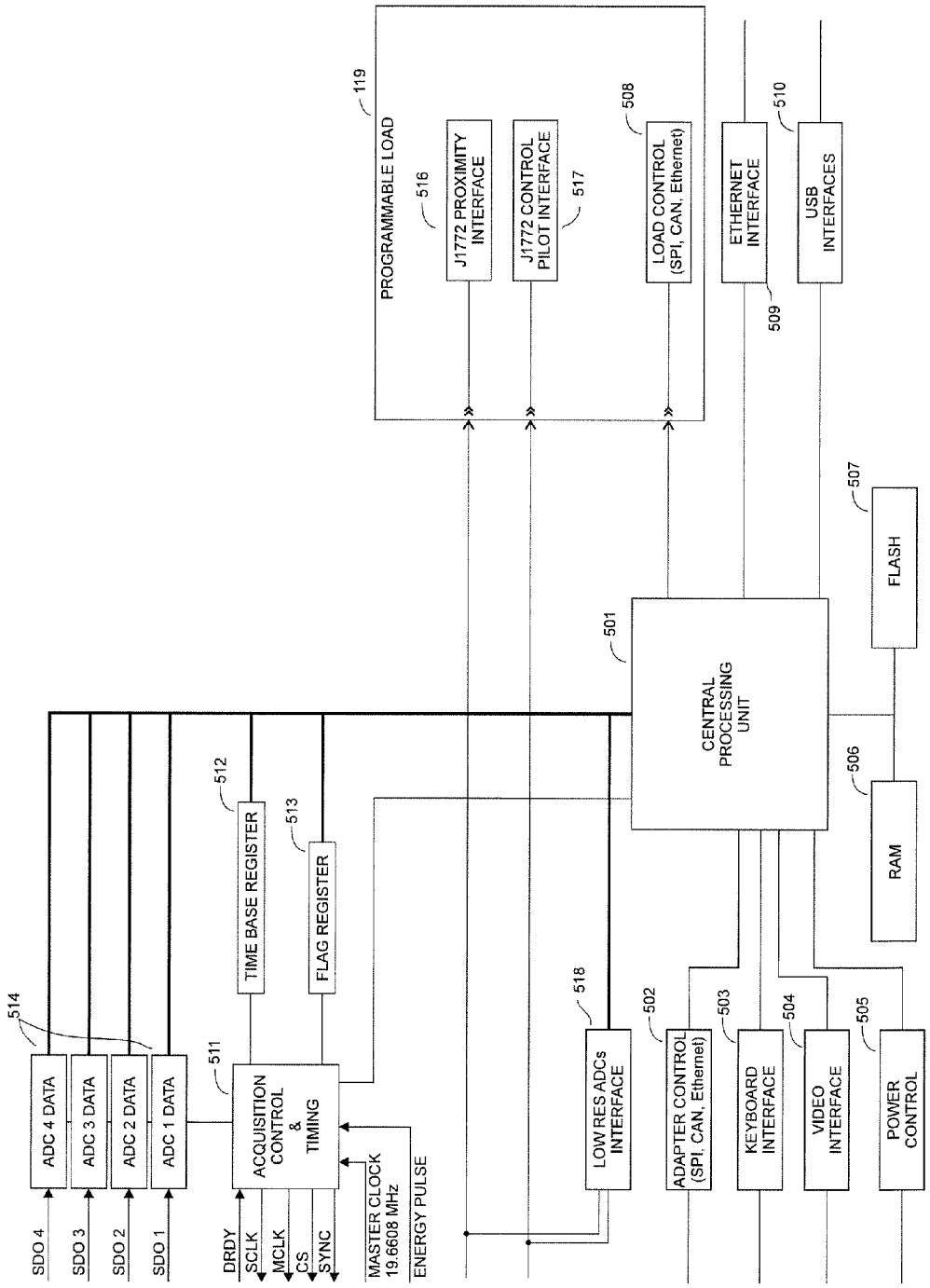
FIG. 5 is a block diagram of the functionality of the digital processing means shown in FIG. 3.

FIG. 5 shows a block diagram of the functionality of the digital processing means 326 according to an exemplary embodiment. This can be implemented in, for example, a field-programmable gate array (FPGA) such as a Xilinx 7-Series FPGA with embedded processor or by combining a smaller FPGA such a 6-Series with a dedicated processor such as a Freescale iMx series processor. In all implementations, the central processing unit 501, serial peripheral interface (SPI bus), controller area network (CAN bus), and ethernet interfaces used for adapter control 502, keyboard interface 503, video interface 504, power control 505, USB interfaces 510, Ethernet interface 509 (if desired in addition to adapter control 502 or secondary adapter interface 508), and secondary adapter interface 508 may all be standard interfaces on embedded processors. The firmware to support these interfaces is generally part of all modern embedded operating systems. Most modern chips appropriate to implement the DPM 326 contain large RAM memories 506 and FLASH memories 507 sufficient for this application. Should either internal memory prove insufficient in size, additional external memory chips (not shown) may easily be added.

The data acquisition and control logic 511 is important to the performance of the system. As one important function, it establishes the data sampling sequence. A master clock of 19.6608 MHz (or some other suitable frequency) is provided by, for example, a crystal oscillator. The 19.6608 MHz is a particularly useful frequency for power measurement applications because it is a multiple of both 50 Hz and 60 Hz. The timing logic may use this base frequency for all operations in the digital processing. From the master clock the two clocks required by the ADC are generated. An exemplary MCLK frequency is 983,040 Hz which is the master clock divided by 20. For the illustrative example configuration shown, SCLK is equal to MCLK. This provides a sample data rate from each ADC of 30,720 Hz. This provides precisely 512 samples per cycle of the 60 Hz waveform. This provides very high sampling for excellent accuracy. Sampling at lower rates of, for example, 256, 128 and 64 samples per cycle also generally provide acceptable performance. Sampling at higher rates (e.g., 1024 or 2048 samples per cycle) could be used, but may provide little additional benefit.

According to an exemplary embodiment, to start the acquisition process, SYNC is asserted for a minimum of 5 MCLK cycles. After a delay of 2370 MCLKs the ADCs will assert DRDY which is used to gate data into the serial to parallel conversion registers 514. When DRDY is deasserted, then a DMA transfer to processor memory is initiated. Included in the data transferred is a time stamp originating from a timer register 512 which increments at the master clock rate and a flag register 513 which contains a bit indicating a zero crossing and a bit indicating an energy pulse. This time stamped data stream is suited to provide all necessary information for the computation of energy detailed below. Once data acquisition is started it will continue at the sample frequency until the digital processing means 326 terminates it.

Today the measurement of power quantities is done almost exclusively with the employment of digital sampling based algorithms. When one has a stream of data based on constant frequency sampling, one can select a set of definitions for Active Power, Apparent Power, and Reactive Power which are easily implemented in modem processors and deliver results which match those expected by a careful engineering analysis.

One of the principal functions of exemplary embodiments of the invention is the accurate calculation of energy. More specifically, the digital processing means 326 is configured to calculate a value of active energy delivered by the EVCS to the load 119. The instrument hardware, in particular one or more measuring devices or transducers 312 and 313, produces a stream of simultaneous or substantially simultaneous measurements of voltage and current. For embodiments with a pair of supply lines, the current measured on Line 1 (wire 308) and Line 2 (wire 307) should be precisely equal but opposite in sign. Only one of the two possible measurements is needed for the calculations. From the voltages measured on Line 1 and Line 2 relative to ground, we compute the voltage difference between the two lines. Given that $I_n$ is the current measured at an instant in time in Line 1 and $V_n$ is the voltage between Line 1 and Line 2, then the various forms of energy can be computed with the measurements $I_n$ and $V_n$ using the standard formulations for active, reactive, and apparent energy in both time domain and frequency domain for AC based systems. For DC based systems only the time domain approach is valid.

Measurements made directly in the time domain have the advantage that they are very simple to implement and provide definitive answers under all conditions. There is no assumption of a repetitive waveform and sudden changes in amplitude are readily handled correctly. There are two implementational complexities in a fixed sampling frequency approach: (1) In the equations defined below, the simplest approach includes any DC component in the signal. However the effect of the DC component can be removed if it is significant. (2) If the frequency of the measured signal is not an exact multiple of the sampling frequency, then care must be taken to measure the actual frequency, use appropriate fractional points at the start and end of the integration, and perform normalization correctly.

| Time Domain Calculations | |
|---|---|
| $V_{rms} = \sqrt{\dfrac{1}{N}\sum_n V_n^2}$ | RMS Voltage (V) |
| $I_{rms} = \sqrt{\dfrac{1}{N}\sum_n I_n^2}$ | RMS Current (I) |
| $P_t = \dfrac{1}{N}\sum_n V_i I_i$ | Active Power ($P_t$) - Calculation includes any DC component as well as all frequencies in the signal up to the Nyquist frequency. |
| $S_t = VA = V_{rms}I_{rms} = \sqrt{\dfrac{1}{N}\sum_{i=0}^{i=N-1} V_i^2 \cdot \dfrac{1}{N}\sum_{i=0}^{i=N-1} I_i^2}$ | Apparent Power ($S_t$) - Calculation includes any DC component as well as all frequencies in the signal up to the Nyquist frequency. |
| $Q_t = \sqrt{S^2 - P^2}$ | Reactive Power ($Q_t$) - There is not a good formulation in the time domain for directly computing Q. This example adopts the approach of computing it from the "Power Triangle" assumption. |

All summations must account for the exact number of samples in a cycle including fractional data points and properly normalize for the length of the cycle when doing multiple cycle summations to calculate energy related quantities. The above are a consistent set of definitions for all of the energy quantities and are the preferred implementation for the system. However, the definitions above are not intended to restrict the system from using alternative definitions based on the sampled voltages and currents if appropriate.

An alternative approach to using the sampling data directly in the time domain is to use the sampling data to do a Fourier analysis on the waveforms. One of the basic assumptions of Fourier analysis is that the waveform is repetitive over the interval of analysis. While real world waveforms are not perfectly repetitive over long periods of time, the assumption of repetitiveness over a small number of cycles is usually quite good.

According to Fourier's Theorem any periodic signal can be represented in the following manner:

$$V(t) = \dfrac{a_0}{2} + \sum_{n=1}^{\infty}(a_n \text{Cos}(n\omega_0 t) + b_n \text{Sin}(n\omega_0 t))$$

| Frequency Domain Calculations | |
|---|---|
| $V_{rms} = \dfrac{1}{\sqrt{2}}\left[\sum_n (a_{vn}^2 + b_{vn}^2)\right]^{1/2}$ | RMS Voltage[1][2] |
| $I_{rms} = \dfrac{1}{\sqrt{2}}\left[\sum_n (a_{in}^2 + b_{in}^2)\right]^{1/2}$ | RMS Current[1][2] |
| $V_1 = \dfrac{1}{\sqrt{2}}\left[\sum_n (a_{in}^2 + b_{in}^2)\right]^{1/2}$ | RMS Voltage - Fundamental Only[1] |
| $I_1 = \dfrac{1}{\sqrt{2}}[a_{i1}^2 + b_{i1}^2]^{1/2}$ | RMS Current - Fundamental Only[1] |
| $P_f = \sum_n |\bar{V}_n \cdot \bar{I}_n| = \dfrac{1}{2}\sum_n(a_{vn}a_{in} + b_{in}b_{vn})$ $= \sum_n V_n I_n \cos(\theta_n)$ | Active Power ($P_f$) - Active power computed by summing the vector dot products for each of the harmonics[1][2] |
| $P_1 = |\bar{V}_1 \cdot \bar{I}_1| = \dfrac{1}{2}[a_{v1}a_{i1} + b_{v1}b_{i1}] = V_1 I_1 \cos(\theta_1)$ | Active Power ($P_1$) - Active power for the fundamental frequency only.[1][2] |
| $S_f = \dfrac{1}{2}\left[\sum_n(a_{vn}^2 + b_{vn}^2)\sum_n(a_{in}^2 + b_{in}^2)\right]^{1/2}$ | Apparent Power ($S_f$) - Apparent power computed by summing the Vrms times Irms for each harmonic.[1][2] |
| $S_1 = \dfrac{1}{2}(a_{v1}^2 + b_{v1}^2)^{1/2}(a_{i1}^2 + b_{i1}^2)^{1/2}$ | Apparent Power ($S_1$) - Apparent power computed as Irms times Vrms for the fundamental only.[1] |
| $Q_f = \sum_n |\bar{V}_n \times \bar{I}_n| = \dfrac{1}{2}\sum_n(a_{vn}b_{in} - a_{in}b_{vn})$ $= \sum_n V_n I_n \sin(\theta_n)$ | Reactive Power ($Q_f$) - Reactive power computed by summing the vector dot products of each of the harmonics[1] |
| $Q_1 = |\bar{V}_n \times \bar{I}_n| = \dfrac{1}{2}(a_{v1}b_{i1} - a_{i1}b_{v1}) = V_1 I_1 \sin(\theta_1)$ | Reactive Power ($Q_1$) - Reactive power for the fundamental only[1] |

Notes:
The $a_0$ component is generally not included but could be if desired.
(2) If N is sufficiently large so all frequencies in the signal are included and the signal is periodic, then this equation will give the exact same value as the same quantity measured in the time domain.

The above frequency domain formulations for Watts and volt-amps (VA) generate numeric results for all periodic waveforms that are the same as those in the time domain. The formulation of the volt-ampere reactive (VAR) calculation takes the single frequency definition of VAR and extends it to the full Fourier spectrum.

$$Q = VI \sin(\theta)$$

For proper application of the above formula the computations should be done over a few cycles at a time for AC signals and then the results of these short interval power calculations are summed over the entire measurement period to produce the relevant energy results. This is especially important when using the Fourier computations under circumstances where the waveforms are varying with time.

In the case of TOTAL test modes described below, the calculations described above can start as soon as voltage is detected on Line 1 and Line 2. All answers will be zero until current begins to flow. The calculations end after the current has ceased to flow, at which point the VI product is again zero. Said differently, for a device 104 giving a value of active energy delivered from an EVCS 101 to a load 119, the value of active energy delivered may be calculated by a digital processing means 326 from a continuous stream of sampling measurements made over an entire time period from a first sampling measurement to a final sampling measurement, where the first sampling measurement starts at or before a start of power transfer through the primary port 105 and the final sampling measurement is made at or after an end of power transfer through the primary port 105.

When the energy pulse mode is being used, a separate set of calculations may be performed in parallel that begins synchronously with an energy pulse and runs for a precise and typically predetermined number of pulses. Each pulse from the EVCS represents a precise amount of energy, for example: If the EVCS emits a pulse every 1.8 W-Hrs and we measure for 100 pulses, we would expect to measure 1.8×100=180 W-Hrs of energy in the device 104.

The digital processing means 326 may also provide support for interfacing with the user through one or more output devices (e.g., a display 107) and one or more user input devices, for example key pad 112. Output and input devices may be one in the same, such as displays 107 which are touchscreens. In some embodiments, measurements may be stored in the memory of the digital processing means 326. Output devices may include one or more displays 107 and/or communication links or interfaces to external devices such as but not limited to external memory devices, laptops, tablet computers, smartphones, or other devices. Communication with external devices, transfer of data, remote control and other features may be facilitated by one or more standard interfaces such as USB 342 and Ethernet 341. The one or more output devices are usable to display or transmit the value of active energy delivered as calculated by the DPM 326 and/or display or transmit one or more values pertaining to the value of active energy delivered (e.g., a difference, percentage error, etc. calculated from the first value of active energy delivered).

After the value of active energy delivered has been determined, it can then be compared with a metered value of active energy delivered given by the EVCS 101 on, for example, a display 102 thereof. In some exemplary embodiments, the digital processing means 326 may be configured to perform this comparison. The device 104 may obtain the metered value of active energy delivered as output by the EVCS by, for example, the user reading the metered value from the EVCS and manually entering it via an input device such as keypad 112. The one or more output devices of the device 104 may then display or transmit to an external device a result of the comparison. The result of the comparison may take a variety of forms. As one example, the result of the comparison may be an indication of whether or not a difference between the value of active energy delivered calculated by the DPM 326 and the metered value of active energy delivered as given the EVCS exceeds some predetermined threshold. Such an error threshold may be set by the manufacturer or by the user and be based on company or industry standards on acceptable error or deviation of an EVCS's internal metering. As another example, the result of the comparison may indicate a magnitude by which the value of active energy delivered calculated by the DPM 326 and the metered value of active energy as given the EVCS differ from one another. A user may in this case then compare this difference to acceptable deviations per a company or industry standard.

The final part of the circuitry required are the several interfaces between the EVCS and the electric vehicle that control the charging process. SAE J1772-201010 is currently the dominant standard for charging in the United States, though it is under revision and expected to change again in the near future. FIG. 3 shows the two communications lines PROXIMITY detect 328 and CONTROL PILOT 327 that are part of the SAE J1772-201010 standard. The signaling sequence for the SAE J1772-201010 standard is well documented in the standard and many websites. Only a brief description is provided here for completeness. Also shown is the interface control signal(s) 329 which allow a multi-protocol interface module 311 to be controlled by the DPM 326.

Figure 6:
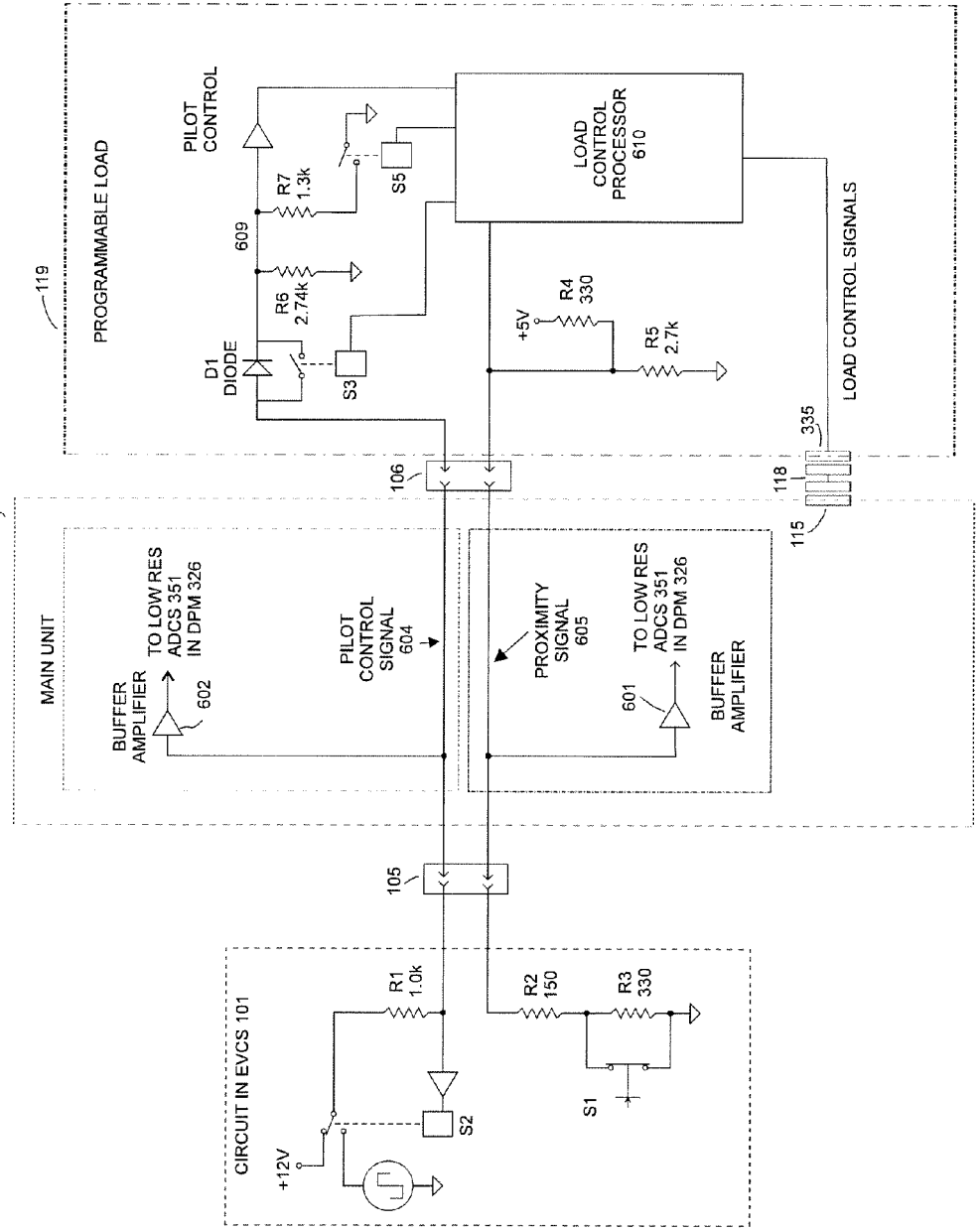
FIG. 6 is example circuitry according to an exemplary embodiment.

FIG. 6 shows example circuitry for an exemplary embodiment which meets the requirements set by SAE J1772-201010. For convenience, the monitoring circuitry for the PROXIMITY detect 328 and CONTROL PILOT 327 signals may be located in the device 104 while the circuitry that responds to the EVCS may be located in the programmable load 119. This allows the device 104 to be the same in all testing modes: that is, whether the load is provided by a programmable load 119 (an "active" test mode) or an EV 111 (a "passive" test mode).

Figure 7:
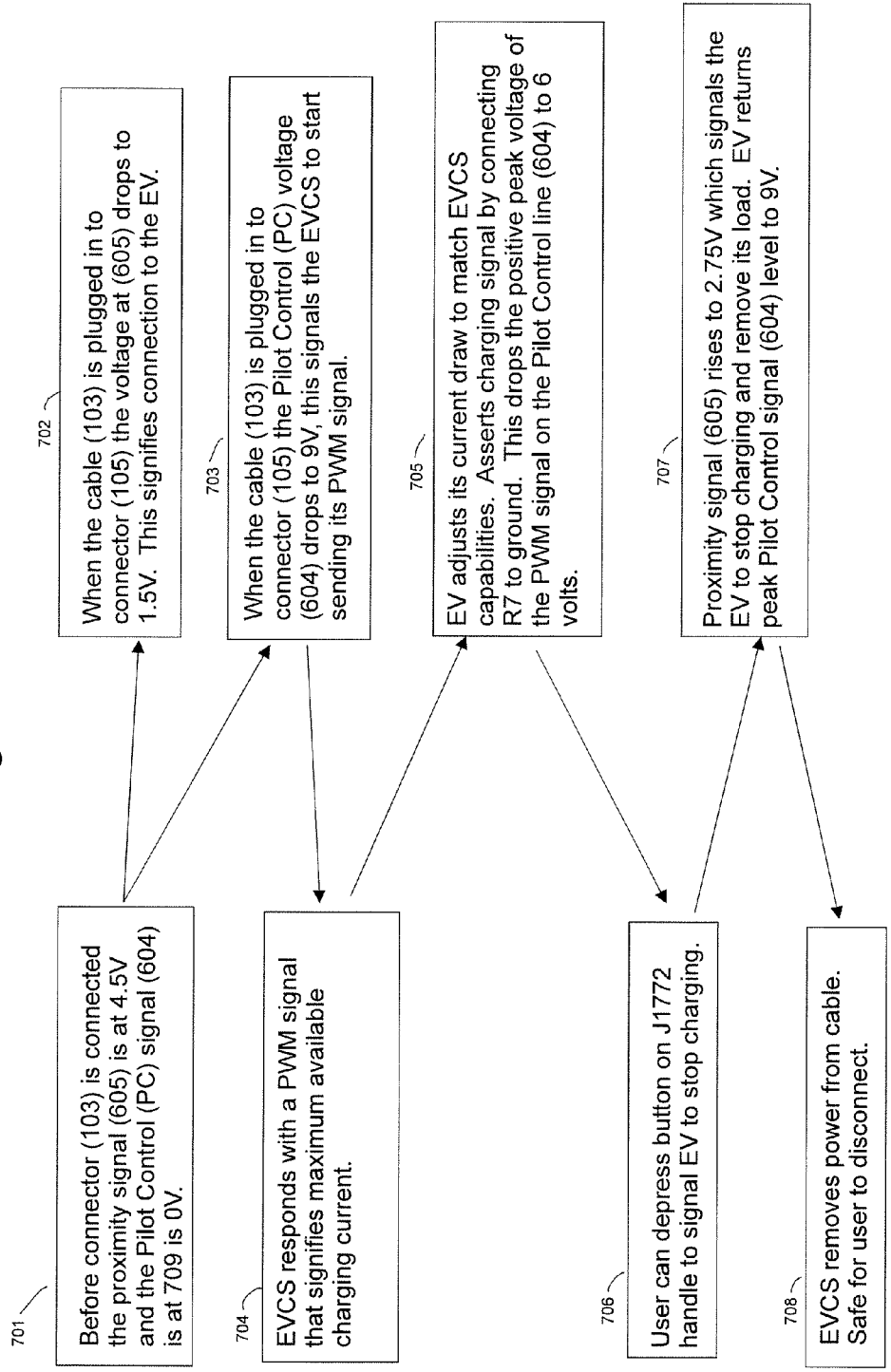
FIG. 7 is an example sequence of events and signals occurring during connection and removal of a charging connection with an electric vehicle.

An example sequence of events and signals occurring during connection and removal of the connector 103 to an EV is shown in FIG. 7. At 701, the connector 103 has not been connected to the EV 111. The proximity signal 605 is at 4.5 V and the PILOT CONTROL (PC) 604 is at 0 V. At 702, connection of the connector 103 causes the voltage at 605 to drop to 1.5 V. This signifies to the electric vehicle that it is connected to a EVCS. At 703, once the connector 103 is plugged into port 105, the PC voltage drops to 9 V, signaling the EVCS to start sending its PWM signal that signifies maximum available charging current at 704. At 705, the EV adjusts its current draw to match the EVCS capabilities. The EV signals that it is charging by connecting R2 to ground. This drops the positive peak voltage of the PWM signal to 6V. The EV continues to charge until the battery is fully charged at 706, the user depresses a button on connector 103 to stop charging. If charging completes, then at 707, the proximity signal rises to 2.75 V which signals the EV to stop charging and remove its load. The EV returns the peak PC level to 9V. At 708, the ECVS removes power from the cable, at which point is safe for the user to disconnect the connector 103 from the EV.

The proximity signal may have three voltage levels as seen by an electric vehicle 111 or the device 104: (1) when no connection is made the voltage is at a maximum (e.g., 4.5VDC), (2) when the connector 103 is connected to the EV 111 or device 104 the voltage drops to a minimum (e.g., 1.5VDC), and (3) if the button on a SAE J1772 handle is pressed the voltage rises back up to a mid level between the maximum and minimum (e.g., 3.0VDC). Dropping the voltage to the minimum (e.g., 1.5VDC) signals the EV 111 or device 104 that an EVCS 101 is connected and starts the charging sequence. Pressing the handle button signals the ECVS 101 that the user wishes to disconnect the charging cable. In the illustrative example shown in FIG. 6, the resistor network with a 330 ohm resistor and 2.7 k ohm resistor together with the buffer amplifier 601 correspond with signal conditioning circuitry 338 in FIG. 3 and proximity interface 516 in FIG. 5.

In continuance of the same illustrative example introduced with respect to FIG. 6, the control pilot (CP) signal is 12 VDC at the J1772 plug before it is connected. When connected the level is pulled down to 9VDC by R6 in the device 104. This is detected by the EVCS 101 and the 12VDC signal is switched by S1 to a +12V to −12V pulse width modulated signal. The frequency is 1000 Hz. The current delivery capability of the EVCS 101 is encoded in the width of the positive portion of the CP signal. A 10% duty cycle signifies 6 A. A 96% duty cycle signifies 80 A. Duty cycles for intermediate levels are specified by the J1772 documentation. When the EV 111 or device 104 detects the PWM signal, it increases the load (e.g., by switching S5 to add R7 in parallel to R6) on the signal, dropping the peak positive voltage to 6V and beginning to draw current not to exceed the maximum signaled by the EVCS 101. When charging is complete the EV 111 or programmable load 119 signals termination of charging by allowing CP to return to 9V peak (R7 is switched out of the circuit). The signal conditioning 339 in FIG. 3 and pilot interface 517 in FIG. 5 is shown in more detail in FIG. 6. A buffer amplifier 602 delivers the CP signal to one of the ADCs 351 that are part of the digital processing means 326. This signal may be digitized at a rate of 100K samples per second or higher. This allows amplitudes, frequency, and pulse width to be monitored.

A device 104 may derive AC power from one or multiple sources. Two exemplary sources are: (1) from the power delivered by the EVCS or (2) from power delivered to the AUX AC power connector 332. A switch 331 may be provided which allows AC power to be directed to the system power module 337 from either the EVCS connection at the primary port 105 or the auxiliary power connection at 332. The system power module 337 converts the AC power to the levels needed by the internal circuitry and may control charging of a battery 333 which serves as a further source of power for the device 104. If auxiliary AC power or EVCS power is available, the system may operate off of that source. If no external power is available, the device 104 may operate off of its internal battery 333. The internal battery 333 may automatically charge if needed when external power is available. The system is capable of operating for normal testing periods exclusively from the battery 333 if needed.

In some exemplary embodiments, a facility such as a ground fault test circuit 306 allows the functionality of the EVCS's ground fault protection circuitry to be tested by applying a known leakage between either of the two power conducting lines 308 and 307 and ground. This test is generally performed outside of the energy measurement process since it should cause an immediate stoppage in the EVCS providing voltage and current to the load.

In some exemplary embodiments, another test function of shorting out diode D1 may be implemented. When the diode is shorted the amplitude of the negative pulse height drops to match the positive pulse height. This is considered an error by the J1772-201010 protocol and should result in immediate removal of the charging voltage and current.

Though the programmable load 119 is conceptually very simple, e.g. a set of appropriately sized resistors switched in and out by relays or electronically with a silicon-controlled rectifier (SCR) or triac, care must be taken in the design, especially at higher currents. For 120 volt EVCSs (Level 1), loads of 120 watts (1.0A), 750 watts (6.3A), 1500 watts (12.6 A), and 1850 watts (15.4 A) can be constructed using heating strips or power resistors with forced air cooling. For 240V systems loads of 120 watts (0.5 A), 1700 watts (7.0 A), 3400 watts (14.0 A), and 7200 watts (30.0 A) can also be constructed from heating strips or power resistors. Based on the current state of standards development, this loading selection is expected to allow all systems of AC Level 1 and 2 and DC Level 1 to be tested. Other load conditions for testing starting current (a very low load) can easily be added to the available load values if required. Loads with much higher current capacity may also be connected, but that is not expected to be required. Industrial style portable heaters can also be effectively used as loads with appropriate controllers to allow load control. Using an electric vehicle 111 as the load always has the advantage of making use of the energy for the test rather than wasting it.

The device 104 may also include additional interfaces available to the DPM 326 to allow it to perform ancillary tasks. For example, a GPS subsystem module 350 would allow the system to determine its location. This may be used to access a database of information stored on the device to determine the test location, possible EVCS systems at the location, and retrieve site specific data to make the test personnel's setup and documentation tasks easier. Test results may also be stored in the database. Wireless communications channels such as ZIGBEE 349, BLUE TOOTH 348, and WIFI 347 may also be included as convenience features to the user to eliminate the need for ancillary equipment at the test site.

Operation

The principal focus of devices and methods herein is the safe and easy determination of the energy measurement and billing accuracy of an EVCS. In particular, devices and methods according to the invention permit determination of active energy delivered to a load. For clarification, instantaneous power is the product of the voltage and current at a moment in time. Active power is "The time average of the instantaneous power over one period of a wave." (IEEE 100). Power is essentially a rate of flow analogous to gallons per minute for a liquid dispenser. We measure power in terms of kilowatts (kW). Energy is the integral of power over a period of time. We measure energy in terms of kilowatt hours (kWh). The analogy to a liquid dispenser is gallons. As an illustrative example, an EVCS operating at 120 VAC and delivering a current of 20 amps rms is operating at a power level of 2.4 kW. If you charged an electric vehicle for 8 hours at this power level you would have delivered 19.2 kWh of energy to the vehicle. That is, 19.2 kWh of active energy has been delivered by the EVCS to the vehicle. Notably, the prior art does not provide any mechanism which determines the active energy delivered by an EVCS to a vehicle or other load.

It should be noted that a determination of energy delivered by an EVCS differs greatly from mere communications protocol verification and validation. While communications protocol verification and validation is useful and employed by exemplary embodiments disclosed herein, these are not the same as a transactional verification whereby an EVCS is tested to determine whether or not the EVCS is accurately reporting the active energy (as measured in, for example, kWh) transferred from/through the EVCS to a load (e.g., an electric vehicle or a load emulating an electric vehicle). In short, communications protocol verification and validation alone fail to take into account or consider measuring an amount of energy, particularly active energy, that is delivered in a single transaction (e.g., a single delivery, analogous to a single fill-up at a gas station pump).

In Schulz (US 2013/0346010 A1), systems and methods of testing and verifying communications protocols are disclosed, but Schulz fails to provide consideration or the necessary implements for calculating a value of active energy delivered by an EVCS to a load. Furthermore, Schulz fails to disclose any form of determining or calculating energy measurement accuracy. In contrast, exemplary embodiments disclosed herein may provide for or perform a comparison of energy delivered values as displayed or output by an EVCS with energy delivered values determined by the devices and methods of embodiments of the invention.

One of the use cases for electric vehicles contemplates allowing the vehicle to provide energy to the electric grid from its battery rather than receive energy from the grid. While this is not yet a common practice, it is a possible mode of operation. The device 104 can be configured to measure power flow in either direction: delivered (EVCS to vehicle) or received (vehicle to EVCS). If this operating mode comes into practice the EVCS's metering functionality will have to be tested for both directions of energy flow.

Exemplary embodiments of the invention support at least two different approaches to the test scenario: active test mode and passive test mode.

Active Test Mode: In active test mode, a load is supplied independent of an actual electric vehicle 111. A programmable load 119 may either be integral with or attachable to device 104 to provide the load 119 required to test the system. Programmable load 119 may be connected to the primary device 104 via the secondary port 106 using connector 120. The programmable load 119 may be either a resistive load or a more complex electronic load designed to emulate the load presented by an electric vehicle. In either case, the current drawn by the load may be controlled by the digital processing means 326 through communication to the load controller 610 via connector/control port 115, cable 118, and connector 335. Within this test mode there are three different scenarios for the accurate measurement of energy flow depending on whether the EVCS is equipped with an energy pulse output 113.

Passive Test Mode: In passive test mode, the EVCS is plugged into the primary port 105 of the invention and an electric vehicle 111 is plugged into the secondary connector 345 of the secondary port 106 using a cable 109. In this test mode, all of the signals from the EVCS 101 are effectively transmitted through the device 104 to the electric vehicle 111 being charged. The device 104 may measure all of the signals transmitted between the EVCS and the EV, verify communications protocols and accuracy, and measure the energy delivered to the vehicle by the EVCS.

FIGS. 8A, 8B, 8C, and 8D show individual flow diagrams for each of four test modes with exemplary operational sequences.

Active Mode, Total Energy Test ("TOTAL")

Figure 8A:
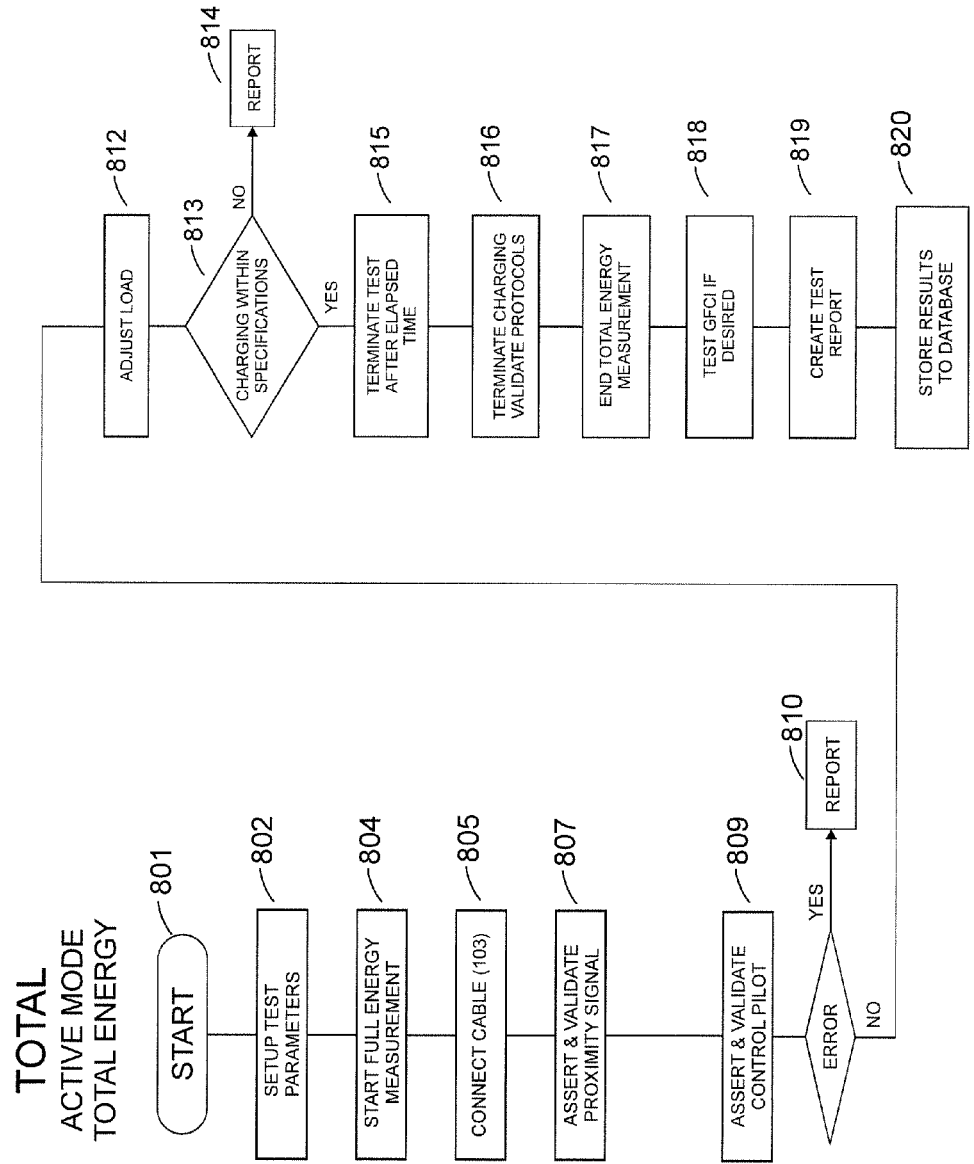
FIG. 8A provides an exemplary operational sequence for the TOTAL test mode.

FIG. 8A is a flow diagram for an active mode, total energy test ("TOTAL"). No energy pulse may be available. In this test mode the device 104 measures all energy flows from the EVCS 101 from the time the EVCS 101 is connected to device 104 until the EVCS 101 is disconnected. This is preferably the default mode of the system.

The process begins at start 801. The user then sets up this mode by interacting with the software through the keypad 112 and display 107. Exemplary setup information entered at 802 is as follows:

Select ACTIVE Mode (Device 104 serves as the load for the EVCS 101 or, alternatively, a standalone programmable load 119 is connected to the secondary port 106 of the device 104.)

Select TOTAL Energy Measurement (All energy delivered by the EVCS 101 is totaled.)

Enter Charging Time (A time to run the test is selected/entered. In this operational sequence, the energy measurement generated by device 104 may be manually compared to the display on the EVCS 101. Alternatively, the data from the EVCS display may be input to the device 104, after which the device 104 (e.g., with DPM 326) computes the accuracy of the EVCS-generated values by a comparison with the values generated by the device 104 itself. The device 104 may also verify the billing computation in addition to the accuracy of the total energy delivered values. In this case, it is advantageous to run the test for a sufficient duration of time to ensure that the resolution of the display of the EVCS 101 does not significantly limit the measurement's accuracy.)

Set Charging Current (The programmable load 119 is enabled by the user selecting the charging current for the test.) As an alternative to the user manually setting a load, the device 104 may operate in an automatic mode ("AUTO") where it selects the load to be applied based on the output capability of the EVCS as encoded in the pilot control signal. Multiple test sequences can also be setup to allow for testing at a high load (>85% of maximum) and at low load (<10%) of maximum automatically.

Test GFCI (ground fault circuit interrupter) (yes or no)

Test pilot control diode (yes or no)

Because this sequence is a TOTAL energy measurement test, energy measurement starts immediately at 804. The user is instructed at 805 to insert the EVCS plug into the primary port 105 of the device 104. On insertion, the device 104 signals the appropriate levels on the PROXIMITY line at 806 and awaits the CONTROL PILOT protocol as discussed earlier in reference to FIG. 6. For some embodiments, the user may have to interact with controls on the EVCS to initiate the CONTROL PILOT exchange. The device 104 verifies the PROXIMITY at 807 and generates a start charging state on the CONTROL PILOT 809. If the exchanges were successful, the EVCS 101 will start delivering power; if not, an error will be reported at 810. If in AUTO load mode, the device 104 adjusts the load 812 if necessary to meet requirements of the applicable standard such as J1772-201010. When the load has been set manually it verifies that the load does not exceed the capability of the EVCS. It then verifies that all charging parameters (e.g., current, voltage, ripple, slew rates, etc.) are within J1772-201010 or other appropriate standard's specifications at 813. If one or more parameters are not within specification, an error is reported at 814, charging is terminated, and the test terminated. If all parameters are within expected ranges, then the test will continue for the preset time at 815. Once the test is completed (e.g. the preset time duration for the test has elapsed as determined by the digital processing means 326), the device 104 will signal via the CONTROL PILOT for the EVCS 101 to stop delivering energy at 816. The communications will be validated for correctness and the termination of energy delivery verified. The device 104 only then terminates TOTAL energy measurement at 817. The device 104 will then display the measurement of the total energy delivered by the EVCS 101 on, for example, display 107. The measurement can be manually compared by the user against the energy registered on the display 102 of the EVCS 101. Alternatively, the data from the EVCS display may be input to the device 104, after which the device 104 (e.g., with DPM 326) computes the accuracy of the EVCS-generated value(s) by a comparison with the values generated by the device 104 itself. The device 104 may also verify the billing computation in addition to the accuracy of the total energy delivered values. If a GFCI test was selected to be run at 818, it may be performed by the device 104 at this point in the operational sequence. The device 104 may create at 819 and store a report of the complete charging session and test results, display the same, and be capable of uploading the report/results through one of its communication ports.

The biggest advantage of this method is that it is a transactional method where the entire "fuelling" process is checked. The total energy delivered as measured by the device is directly compared to the readings of the EVCS for both total energy and billing amount. Another advantage of this test sequence is that it does not require an energy pulse output from the EVCS. A possible disadvantage is that it may take a comparatively long time to get sufficient resolution on the EVCS display for an accurate measurement with which to compare the total energy measurement output of the device 104. If the EVCS has a display resolution of, for example, 0.001 kWh then this will not be an issue. This approach emulates the method used to check gas pumps in that it measures the total energy (fuel) delivered in the transaction, similar to measuring the total volume of gasoline delivered in a transaction.

Active Mode, Standard Meter Test ("STANDARD")

Figure 8B:
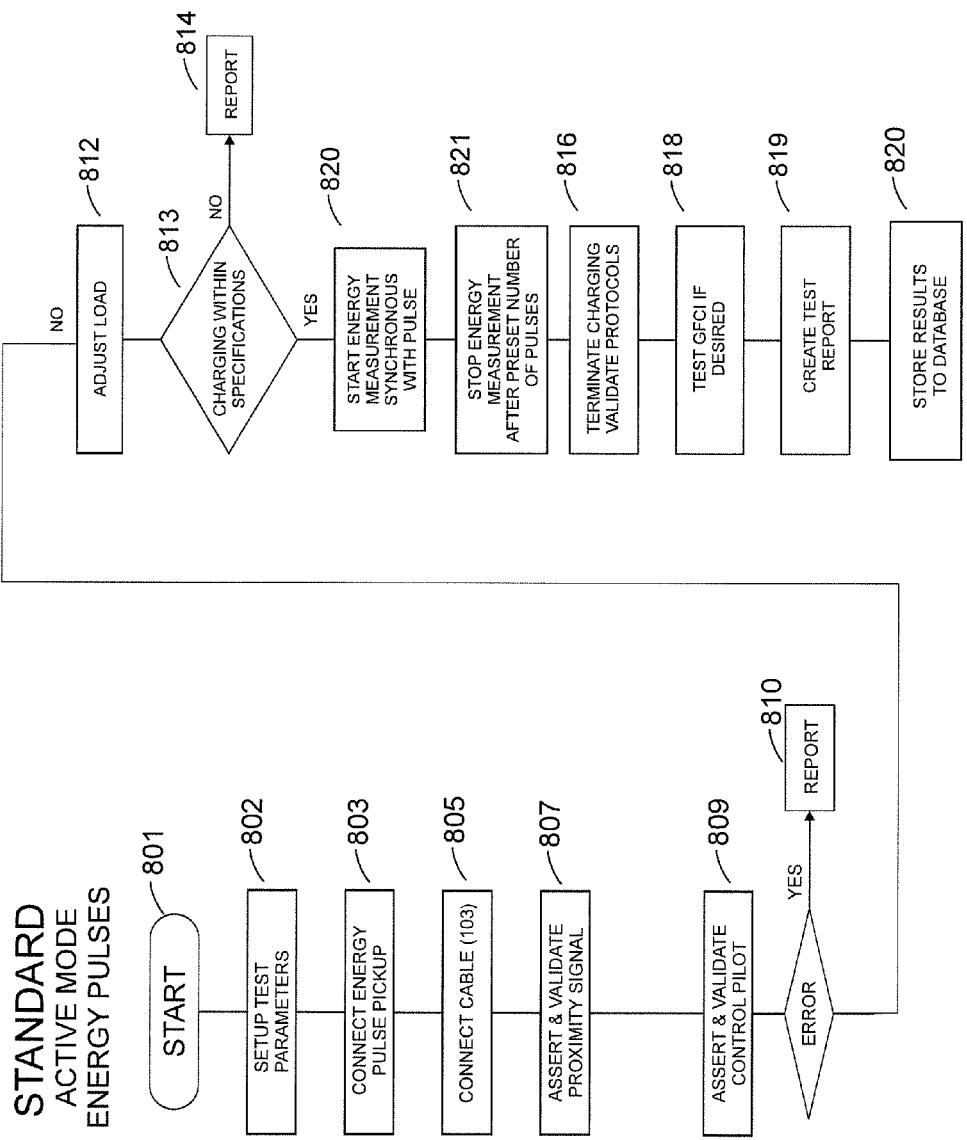
FIG. 8B provides an exemplary operational sequence for the STANDARD test mode.

FIG. 8B is a flow diagram for an active mode, standard meter test ("STANDARD"). Energy pulse output is available on the EVCS. For revenue metering in the normal electric power industry all meters provide an infrared energy pulse output (ANSI C12.20 Section 4.6). A pulse is output each time a specific amount of energy is measured by the EVCS. In some exemplary embodiments, the device 104 may compare the measurement of energy delivered as determined by the device 104 itself with the number of pulse intervals over which the measurement was made. In this way, a very accurate comparison may be made independent of a display of limited resolution on the EVCS. This approach may be primarily used by EVCS manufacturing companies since it does not provide a full transactional check.

In this mode, the device 104 first establishes a steady state charging situation, then measures energy for a fixed number of energy pulses from the EVCS, then terminates the charging process. The process begins at start 801. The user then sets up this mode by interacting with the device 104 firmware/software through, for example, the keypad 112 and display 107. The necessary setup information is entered at 802 and may include:

Select ACTIVE Mode (Device 104 serves as the load for the EVCS 101 or, alternatively, a standalone programmable load 119 is connected to the secondary port 106 of the device 104.)

Select Standard Meter Test (The energy measurement will be made for a specified number of pulses.)

Set Number of pulses (A number of test pulses will be selected.)

Set Charging Current (The programmable load 119 is enabled by the user selecting the charging current for the test.) As an alternative to the user manually setting a load, the device 104 may operate in an automatic mode ("AUTO") where it selects the load to be applied based on the output capability of the EVCS as encoded in the pilot control signal. Multiple test sequences can also be setup to allow for testing at a high load (>85% of maximum) and at low load (<10%) of maximum automatically.

Test GFCI (yes or no)

Test pilot control diode (yes or no)

The user is instructed to attach the energy pulse pickup 108 to the EVCS at 803. Because the device 104 is set to a STANDARD meter mode, energy measurement will not start until stable charging conditions have been established. The user is instructed at 805 to insert the EVCS plug 103 into the primary port 105 of the device 104. Upon insertion the device 104 signals the appropriate levels as determined by J1772-201010 or other applicable standard on the PROXIMITY line 807 and awaits the CONTROL PILOT protocol. The user may have to interact with controls on the EVCS to initiate the CONTROL PILOT exchange. The instrument verifies the PROXIMITY at 806 and generates a start charging state on the CONTROL PILOT 809. If the exchanges were successful the EVCS will start delivering power. Otherwise, an error will be reported 810. The device 104 may adjust the load at 812 if necessary to meet the testing requirements as specified in the setup. It then verifies that all charging parameters are within specifications set by J1772-201010 or other applicable standards at 813. If charging parameters are not within specifications, an error is reported at 814 and the test is terminated. If all parameters are within expected ranges, then the test is permitted to continue. Energy measurement preferably commences synchronously with the first pulse after the charging current has been stabilized at 820. Power measurement will continue for the preset number of pulses. Once the number of energy pulses reaches the preset limit, the measurement of energy will be stopped synchronously with an energy pulse at 821. At this point the test is complete, and the device 104 will signal via the CONTROL PILOT for the EVCS 101 to stop delivering energy at 816. The communications will be validated for correctness and the termination of energy delivery verified at 816 (e.g., by the digital processing means 326). If a GFCI test 818 was selected to be run, it may be performed by the device 104 at this point in the operational sequence. The device 104 may create a test report at 819 that presents the accuracy of the metering of the EVCS as computed by comparison with the energy pulse output of the EVCS. The instrument may store a report of the complete charging session and test results, display the same, and be capable of uploading the results through one of its communication ports.

An advantage of this approach is that a very accurate test of the metering accuracy of an EVCS can be conducted in a very short period of time that is independent of the resolution of the EVCS display. A disadvantage of this approach is that it does not measure the total energy delivered, i.e. it is not a full transactional verification. Hence, it is not the equivalent to testing a gas pump which verifies that when it reads that it has dispensed 5 gallons of gas, precisely 5 gallons has been dispensed.

The disadvantages of the two modes above can be addressed through a DUAL mode which allows the instrument to do both modes simultaneously.

Active Mode, Dual Energy Test ("DUAL")

Figure 8C:
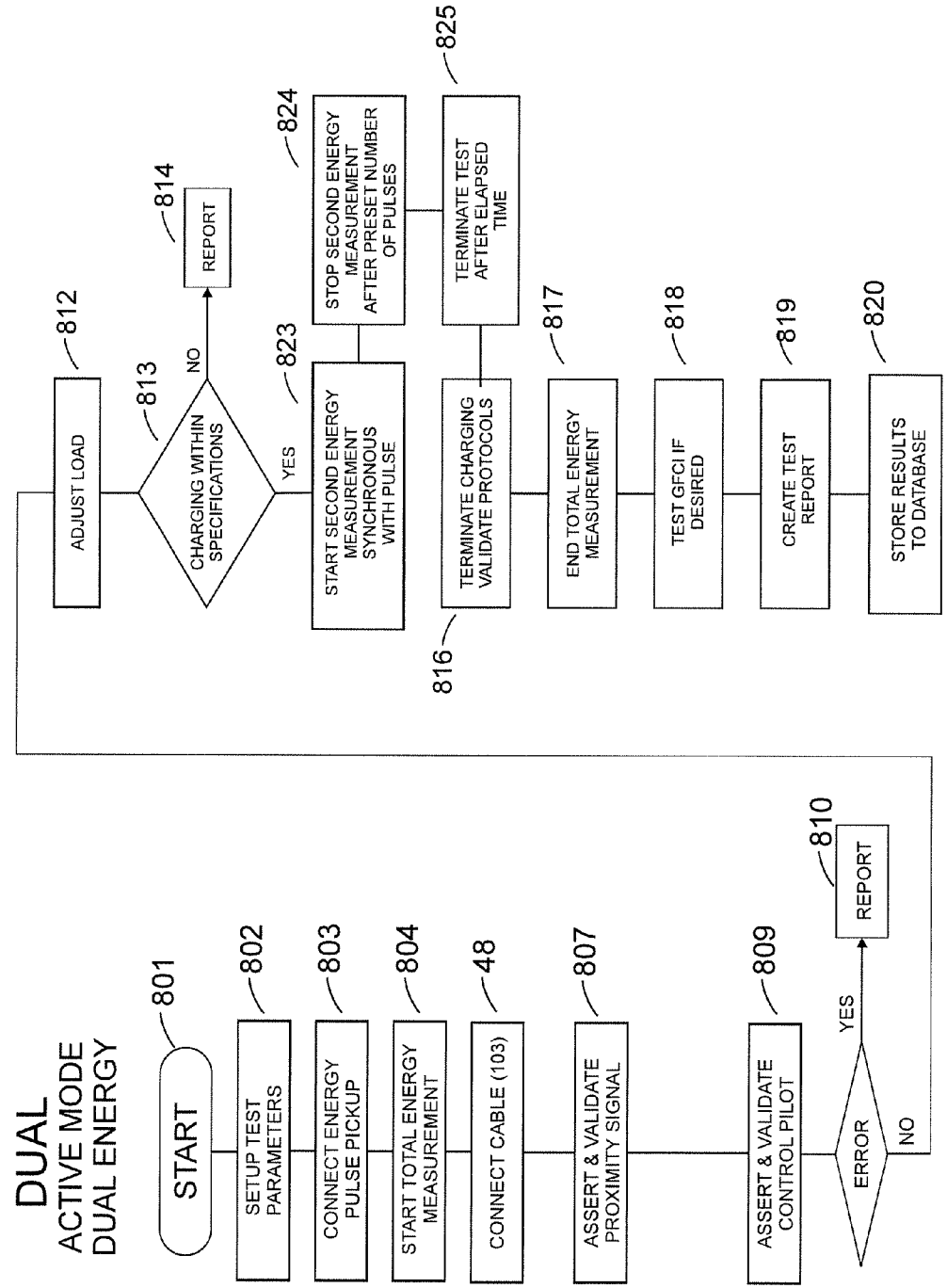
FIG. 8C provides an exemplary operational sequence for the DUAL test mode.

FIG. 8C is a flow diagram for an active mode, dual energy test ("DUAL"). This DUAL mode can be used if the EVCS has an energy pulse output 113.

In this mode the device 104 measures all energy flows from the EVCS from the time the EVCS 104 starts to the time charging is completed. However, like the Standard Meter Test mode, it also measures the precise energy delivered during a set number of energy pulses. This permits testing both total energy delivered and fundamental metering accuracy simultaneously.

The process begins at start 801 and proceeds similar to the Active Mode, Total Energy Test described above. The necessary setup information 802 may be very similar to the Active/Total Energy Test mode:

Select ACTIVE Mode (Device 104 serves as the load for the EVCS 101 or, alternatively, a standalone programmable load 119 is connected to the secondary port 106 of the device 104.)

Select DUAL Test (Both TOTAL and STANDARD tests will be run simultaneously.)

Set Number of Pulses (A number of energy pulses will be entered.)

Set Charging Time (A time to run the test is selected/entered.)

Set Charging Current (The programmable load 119 is enabled by the user selecting the charging current for the test.) As an alternative to the user manually setting a load, the device 104 may operate in an automatic mode ("AUTO") where it selects the load to be applied based on the output capability of the EVCS as encoded in the pilot control signal. Multiple test sequences can also be setup to allow for testing at a high load (>85% of maximum) and at low load (<10%) of maximum automatically.

Test GFCI (yes or no)

The user is instructed to attach the energy pulse pickup 108 to the EVCS 101 at 803. Energy measurement starts immediately as in TOTAL test mode at 804. The user is instructed at 805 to insert the EVCS plug 103 into the primary port 105 of the device 104. Upon insertion the device 104 signals the appropriate levels on the PROXIMITY line at 807 and awaits the CONTROL PILOT protocol. The user may have to interact with controls on the EVCS 101 to initiate the CONTROL PILOT exchange. The device 104 verifies the PROXIMITY at 807 and generates a start charging state on the CONTROL PILOT 809. If the exchanges were successful, the EVCS will start delivering power. Otherwise, an error may be reported at 810. The instrument adjusts the load at 812 if necessary to meet requirements. It then verifies that all charging parameters are within specifications at 813. If charging parameters are not within specifications, an error may be reported at 814 and the test terminated. Pulse based energy measurement will commence synchronously with the first pulse after the charging current has been stabilized at 823. Pulse based energy measurement will continue for the preset number of pulses at 824. Once the preset measurement time has been reached at 825, the EVCS will be signaled to cease charging at 816 and the termination protocol validated. TOTAL energy measurement is then terminated at 817. The instrument will display the measurement of total energy delivered by the EVCS which can then be manually compared against the energy registered on the display of the EVCS. Alternatively, the data from the EVCS display may be input to the device 104, after which the device 104 (e.g., with DPM 326) computes the accuracy of the EVCS-generated values by a comparison with the values generated by the device 104 itself. The device 104 may also verify the billing computation in addition to the accuracy of the total energy delivered values. If a GFCI test at 818 was selected to be run, it may be performed at this point in the operation sequence. The device 104 may create at 819 and store a report of the complete charging session and test results, display the same, and be capable of uploading the results through one of its communication ports.

An advantage of this approach is that it makes both a high accuracy energy pulse based measurement and a TOTAL energy measurement during the same test run. This provides data analogous to the testing procedure used for ANSI C12 revenue meters and TOTAL energy data analogous to the current gas pump test process.

Passive Mode, Dual Energy Test ("PASSIVE")

Figure 8D:
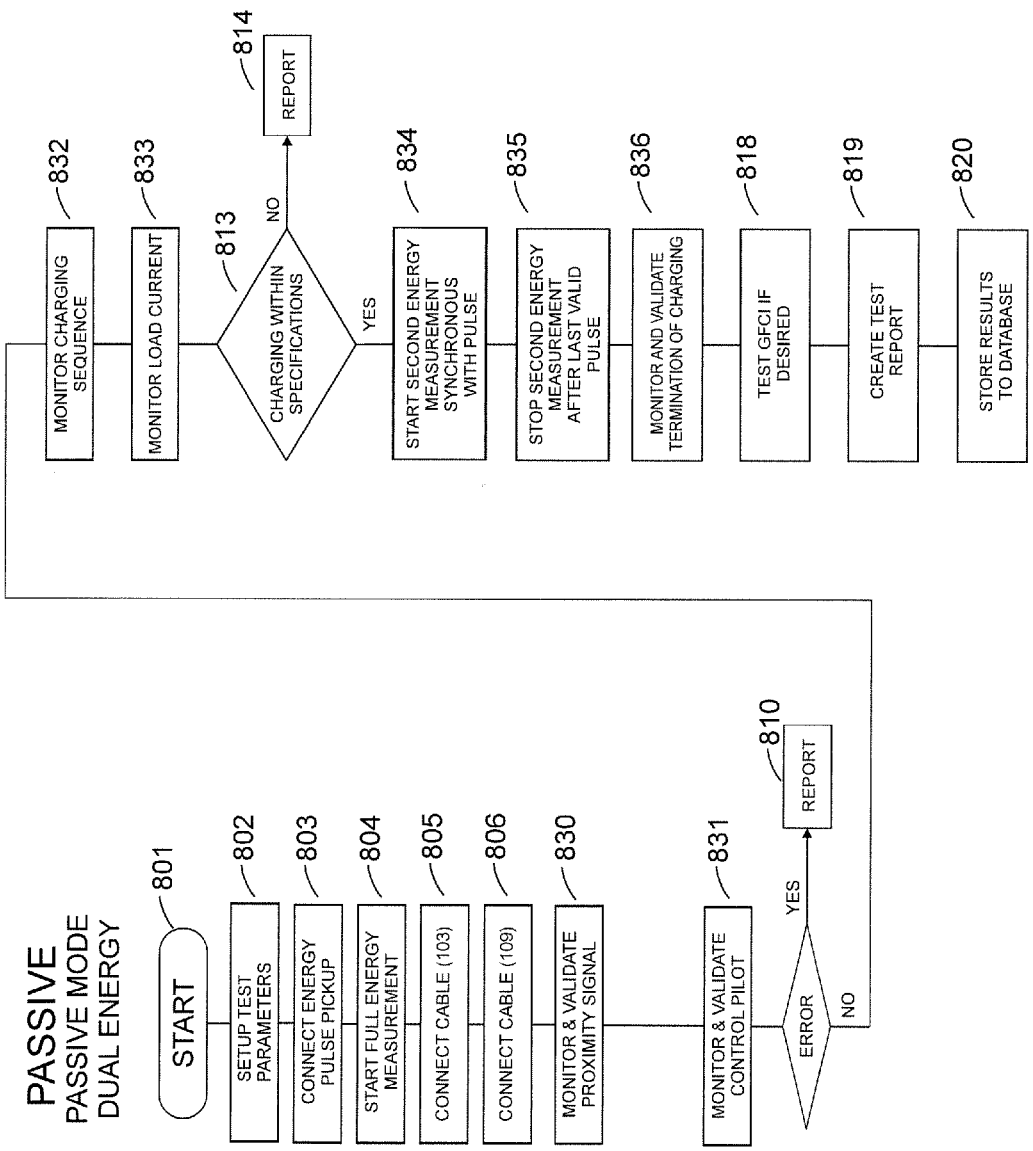
FIG. 8D provides an exemplary operational sequence for the PASSIVE test mode.

FIG. 8D is a flow diagram for a passive mode, dual energy test ("PASSIVE"). In PASSIVE mode, the device 104 is connected in series between the EVCS 101 and the electric vehicle 111 as shown, for example, in FIG. 2. In this approach, the device 104 does not actively participate in the charging process. Rather, it monitors all signals passing between the EVCS 101 and the actual electric vehicle 111.

In this approach the electric vehicle is in complete control of the charging process. In other words, the device 104 is not in control of the charging process. The device 104 may be configured or configurable to measure some or all energy flows to and/or from the EVCS 101 from the time the EVCS starts delivering energy until the time charging is completed. The process begins at start 801. The user then sets up this mode by interacting with the device 104 firmware/software through, for example, the keypad 112 and display 107. Setup information entered at 802 may include one or more of the following:

Select PASSIVE Mode (The electric vehicle 111 serves as the load for the EVCS.)

Select DUAL Energy Measurement (Both total energy delivered and pulse based accuracy measurements may be made.)

Number of Energy Pulses (The system may automatically use the maximum number of whole pulse intervals during the period that the charge current is stable.)

Charging Time (This not required to be set in the device 104 since it is controlled by the electric vehicle.)

Charging Current (This not required to be set in the device 104 because it is controlled by the electric vehicle.)

The user is instructed to attach the energy pulse pickup to the EVCS at 803 if the EVCS has that capability. Energy measurement starts immediately as in TOTAL energy mode at 804. The user is instructed at 805 to insert the EVCS plug 309 into the primary port 105 of the device 104. The user is also instructed at 806 to insert one end of cable 109 into the secondary port 106 and the other end of the cable 109 into the electric vehicle connector/port 110. Once the ECVS 101 and the EV 111 are connected to the device 104, the EVCS and electric vehicle will exchange PROXIMITY signals. This is monitored by the device 104 at 830. This will be followed by an exchange of the CONTROL PILOT protocol. This is also monitored by the device 104 at 831. If an invalid exchange is detected, then an error report will be generated at 810. While the charging sequence is running it is monitored for out of specification operation at 832 which is reported at 814 if detected. Load current is also monitored and optionally recorded at 833. Once a stable charging situation is reached between the ECVS 101 and the EV 111, a pulse based energy measurement will begin on the first energy pulse detected at 834. Pulse based energy measurement will be terminated on the last valid energy pulse received during stable charging at 835. When initiated by the electric vehicle 111 the termination sequence on the CONTROL PILOT line will be monitored and validated by the device 104 at 836. If a GFCI test was selected to be run, it may be performed at 818 after completing measurements for determining power delivered by the EVCS. At 819, the device 104 may create and store a report of the complete charging session and test results, display the same, and be capable of uploading the results through one of its communication ports.

An advantage of this approach is that it makes both a high accuracy energy pulse based measurement and a TOTAL energy measurement during the same test run. This provides data analogous to the testing procedure used for ANSI C12 revenue meters and TOTAL energy data analogous to the current gas pump test process. Another advantage is that for high current situations the EV provides the load thus eliminating the issue of very large heat dissipation in a resistive programmable load part of or attached to the device 104.

While exemplary embodiments of the present invention have been disclosed herein, one skilled in the art will recog-

What I claim is:

1. An instrument for accurately verifying the active energy delivered by an electric vehicle charging station (EVCS), comprising:
   a primary port for receiving a charging cable normally connecting the EVCS to an electric vehicle;
   one or more measuring devices which simultaneously make sampling measurements of voltage and current from one or more supply lines delivering power from the EVCS to a load after the charging cable has been received at the primary port;
   digital processing means configured to calculate a first value of active energy delivered by the EVCS to the load from the sampling measurements obtained from the one or more measuring devices; and
   at least one output device for displaying or transmitting the first value of active energy delivered or one or more values determined from the first value of active energy delivered for comparison with a metered value of active energy delivered as given by the EVCS.

2. The instrument of claim 1, wherein the one or more measuring devices make a first sampling measurement at or before a start of power transfer through the primary port and a final sampling measurement at or after an end of power transfer through the primary port, the first value of active energy delivered being calculated from a continuous stream of sampling measurements made over an entire time period from the first sampling measurement to the final sampling measurement.

3. The instrument of claim 1, wherein the digital processing means is further configured to make the comparison of the first value of active energy delivered and the metered value of active energy delivered.

4. The instrument of claim 3, wherein the at least one output device displays or transmits a result of the comparison as one of the one or more values determined from the first value of active energy delivered.

5. The instrument of claim 3, wherein the result of the comparison is an indication of whether or not a difference between the first value of active energy delivered and the metered value of active energy delivered exceeds a predetermined threshold.

6. The instrument of claim 3, wherein the result of the comparison indicates a magnitude by which the first value of active energy delivered and the metered value of active energy differ from one another.

7. The instrument of claim 1, further comprising an energy pulse pickup connectable to the EVCS to receive pulses indicating delivery of one or more fixed quantities of active energy as given by the EVCS.

8. The instrument of claim 7, wherein the digital processing means is further configured to calculate a second value of active energy delivered over a predetermined number of pulses, the second value of active energy delivered being usable to verify EVCS metering accuracy.

9. The instrument of claim 8, wherein the digital processing means is capable of calculating both the first value of active energy delivered and the second value of active energy delivered during a single operational test sequence.

10. The instrument of claim 8, wherein the second value of active energy delivered is usable to verify EVCS metering accuracy independent of the first value of active energy delivered.

11. The instrument of claim 1, wherein the instrument comprises the load to which power from the EVCS is delivered.

12. The instrument of claim 1, further comprising a secondary port for connecting to an electric vehicle or a standalone programmable load capable of emulating an electric vehicle load, the electric vehicle or standalone programmable load serving as the load to which power from the EVCS is delivered.

13. The instrument of claim 1, further comprising a facility for testing operation of a ground fault protection of the EVCS.

14. The instrument of claim 1, wherein the one or more output devices includes one or more interfaces for communicating any or all of its test results and setup information to a laptop, tablet computer, smart phone, external memory device, or other device.

15. The instrument of claim 1, further comprising communication means which allow the instrument to communicate with the EVCS to determine the performance capability of the EVCS and synchronize operation of the EVCS if the EVCS is capable of providing performance information.

16. The instrument of claim 1, wherein the primary port allows a plurality of different types of EVCS connectors with different protocols to be accommodated through interchangeable connector modules.

17. The instrument of claim 1, wherein the one or more measuring devices are configured to measure both energy delivered by the EVCS to the load and energy delivered to the EVCS from an external source.

18. The instrument of claim 1, wherein the digital processing means is further configured to calculate a value of apparent energy.

19. The instrument of claim 1, wherein the digital processing means is further configured to calculate a value of reactive energy.

20. The instrument of claim 1, wherein the data processing means contains a memory in which the instrument stores site and test information for later upload.

21. The instrument of claim 1, further comprising a GPS subsystem usable to identify a test site and access site specific information stored in memory.

22. A method for accurately verifying the active energy delivered by an electric vehicle charging station (EVCS), comprising steps of:
   receiving at a primary port a charging cable normally connecting the EVCS to an electric vehicle;
   making sampling measurements of voltage and current simultaneously from one or more supply lines delivering power from the EVCS to a load after the charging cable has been received at the primary port;
   calculating a first value of active energy delivered by the EVCS to the load from the sampling measurements with a digital processing means; and
   displaying or transmitting the first value of active energy delivered or one or more values determined from the first value of active energy delivered with at least one output device for comparison with a metered value of active energy delivered as given by the EVCS.

23. The method of claim 22, wherein the step of making sampling measurements includes making a first sampling measurement at or before a start of power transfer through the primary port and a final sampling measurement at or after an end of power transfer through the primary port, the first value of active energy delivered being calculated in the calculating step from a continuous stream of sampling measurements made over an entire time period from the first sampling measurement to the final sampling measurement.

24. The method of claim 22, further comprising a step of comparing the first value of active energy delivered with the metered value of active energy delivered.

25. The method of claim 24, wherein said step of displaying or transmitting includes displaying or transmitting a result of the comparison as one of the one or more values determined from the first value of active energy delivered.

26. The method of claim 24, wherein the result of the comparison is an indication of whether or not a difference between the first value of active energy delivered and the metered value of active energy delivered exceeds a predetermined threshold.

27. The method of claim 24, wherein the result of the comparison indicates a magnitude by which the first value of active energy delivered and the metered value of active energy differ from one another.

28. The method of claim 22, further comprising a step of calculating a second value of active energy delivered over a predetermined number of pulses received from the ECVS with an energy pulse pickup, the second value of active energy delivered being usable to verify EVCS metering accuracy.

29. The method of claim 28, wherein the second value of active energy delivered is usable to verify EVCS metering accuracy independent of the first value of active energy delivered.

* * * * *